US012614006B2

(12) United States Patent
Ning et al.

(10) Patent No.: US 12,614,006 B2
(45) Date of Patent: Apr. 28, 2026

(54) MOVEMENT DEMAND ESTIMATION AND PEOPLE FLOW ESTIMATION SYSTEMS AND METHODS

(71) Applicant: HITACHI, LTD., Tokyo (JP)

(72) Inventors: Rui Ning, Tokyo (JP); Manabu Katou, Tokyo (JP); Masayasu Fujiwara, Tokyo (JP); Wataru Toriumi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 1174 days.

(21) Appl. No.: 17/781,269

(22) PCT Filed: Feb. 4, 2020

(86) PCT No.: PCT/JP2020/004109
§ 371 (c)(1),
(2) Date: May 31, 2022

(87) PCT Pub. No.: WO2020/240932
PCT Pub. Date: Dec. 3, 2020

(65) Prior Publication Data
US 2023/0359783 A1      Nov. 9, 2023

(30) Foreign Application Priority Data
May 28, 2019      (JP) ................................. 2019-098982

(51) Int. Cl.
*G06F 30/13* (2020.01)
*B66B 1/24* (2006.01)
*B66B 5/00* (2006.01)

(52) U.S. Cl.
CPC ............ *G06F 30/13* (2020.01); *B66B 1/2458* (2013.01); *B66B 5/0037* (2013.01)

(58) Field of Classification Search
CPC ....... G06F 30/13; G06F 30/20; B66B 1/2458; B66B 5/0037
See application file for complete search history.

(56) References Cited

U.S. PATENT DOCUMENTS

2020/0247644 A1      8/2020  Ning et al.

FOREIGN PATENT DOCUMENTS

JP          9-190463 A      7/1997
JP          2009-96612 A    5/2009
(Continued)

OTHER PUBLICATIONS

Lang, Z., et al. "A Three-level Human Movement Model in the Whole Building Scale" IEEE 12th Int'l Conf. on Control & Automation ICCA, pp. 836-841 (2016) (Year: 2016).*
(Continued)

*Primary Examiner* — Jay Hann
(74) *Attorney, Agent, or Firm* — Crowell & Moring LLP

(57)      ABSTRACT

A people flow estimation system uses input of movement model data to create movement demand data and estimate the flow of people inside a building using architectural model data. The people flow estimation system is characterized by identifying the names or uses of rooms in the building and the density of in-building personnel; recording occurrence distribution of movement demand inside the building with respect to a reference time; converting the architectural model data into layout data; calculating the number of in-building personnel in a room; and calculating movement demand data from the number of in-building personnel and the data from the recorded movement demand distribution.

19 Claims, 17 Drawing Sheets

(56)  References Cited

FOREIGN PATENT DOCUMENTS

| JP | 2014-10659 | A | | 1/2014 |
|----|------------|---|---|--------|
| JP | 2016-222114 | A | | 12/2016 |
| JP | 6203332 | B1 | * | 9/2017 |
| JP | 2019-40475 | A | | 3/2019 |
| WO | WO 2019/087729 | A1 | | 5/2019 |

OTHER PUBLICATIONS

Godwin, A., et al. "Development of Simulation System for Lift Design" ICSE Coventry Industrial Paper (2009) (Year: 2009).*

Siikonen, M.L. "Planning and Control Models for Elevators in High-Rise Buildings" Thesis, Helsinki U. Tech. (1997) (Year: 1997).*

Steele, T. & Brown, M. "Ashrae Standard 62-1989 Energy, Cost, and Program Implications" Bonneville Power Administration ( 1990) available from <https://www.osti.gov/biblio/5209141> (Year: 1990).*

Hopkin, C., et al. "Residential Occupant Density Distributions Derived from English Housing Survey Data" Fire Safety J., vol. 104, pp. 147-158 (Mar. 2019) available from <https://www.sciencedirect.com/science/article/pii/S0379711218304612> (Year: 2019).*

Li, K., et al. "Building Occupancy Estimation with People Flow Modeling in AnyLogic" IEEE 12th Int'l Conf. on Control & Automation, ICCA, pp. 669-672 (2016) (Year: 2016).*

Sorsa, J., et al. "Modeling uncertain passenger arrivals in the elevator dispatching problem with destination control" Optim. Lett., vol. 12, pp. 171-185 (2017) (Year: 2017).*

International Search Report (PCT/ISA/210) issued in PCT Application No. PCT/JP2020/004109 dated Mar. 31, 2020 with English translation (five (5) pages).

International Preliminary Report on Patentability (PCT/IB/373) issued in PCT Application No. PCT/JP2020/004109 dated Nov. 16, 2021 including Written Opinion (PCT/ISA/237) with English translation (seven (7) pages).

* cited by examiner

*FIG. 3*

| IN-BUILDING PERSONNEL DENSITY | ROOM NAME |
|---|---|
| HIGH<br>(0.25 PERSON/m²) | MARKETING DEPARTMENT<br>GENERAL AFFAIRS DEPARTMENT<br>... |
| MEDIUM<br>(0.10 PERSON/m²) | COMPLIANCE MANAGEMENT DEPARTMENT<br>PLANNING DEPARTMENT<br>... |
| LOW<br>(0.05 PERSON/m²) | SECRETARIAL OFFICE<br>AUDITORS OFFICE<br>... |
| FIXED<br>(ONE PERSON/ROOM) | EXECUTIVE OFFICE<br>... |
| NO PERSONNEL | CONFERENCE ROOM<br>LAVATORY<br>SHOP<br>... |
| NOT ELIGIBLE | ELEVATOR HALL<br>CORRIDOR<br>... |

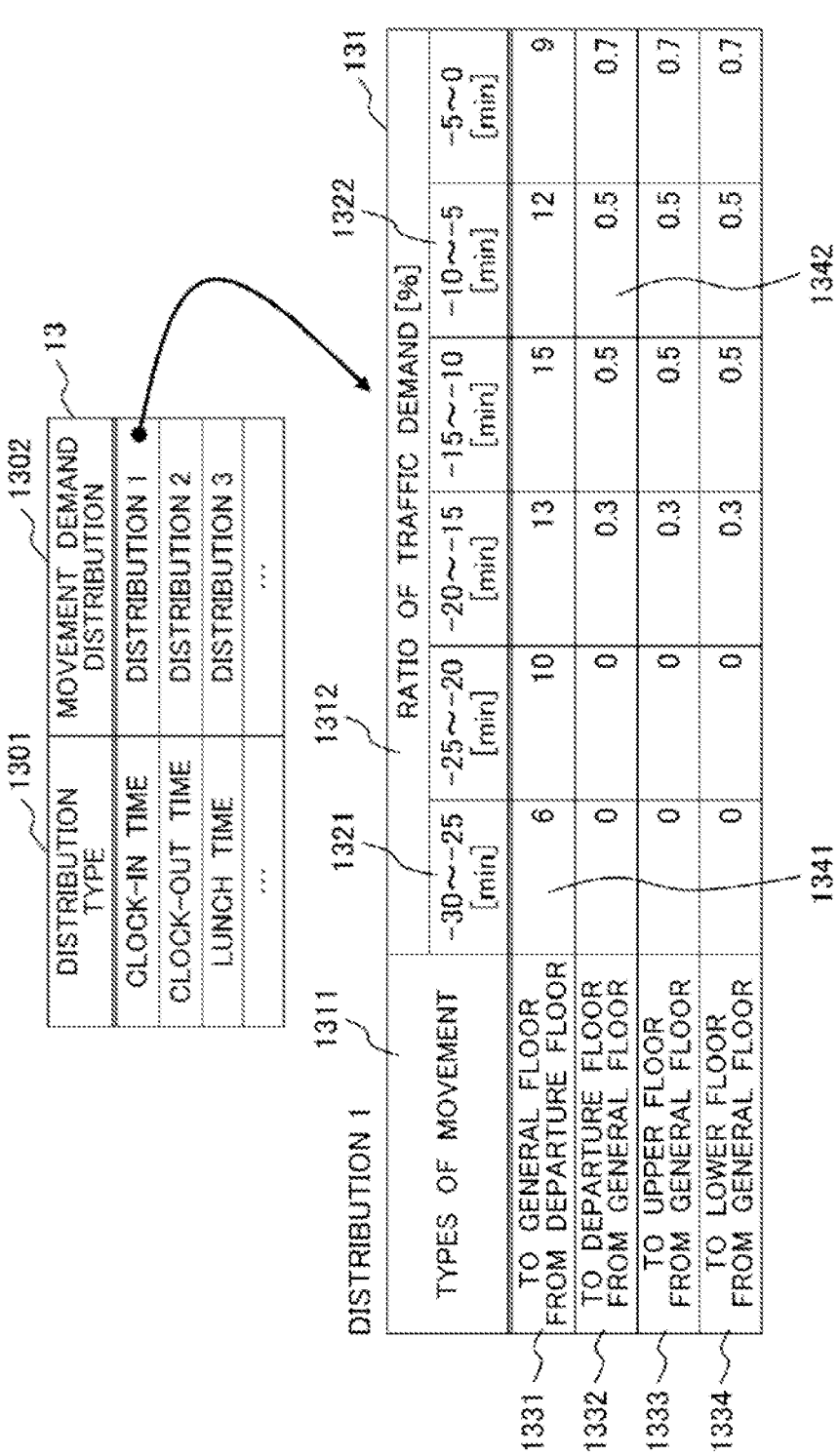

| DISTRIBUTION TYPE | MOVEMENT DEMAND DISTRIBUTION |
|---|---|
| CLOCK-IN TIME | DISTRIBUTION 1 |
| CLOCK-OUT TIME | DISTRIBUTION 2 |
| LUNCH TIME | DISTRIBUTION 3 |
| ... | ... |

DISTRIBUTION 1

| TYPES OF MOVEMENT | RATIO OF TRAFFIC DEMAND [%] | | | | | | | |
|---|---|---|---|---|---|---|---|---|
| | -30~-25 [min] | -25~-20 [min] | -20~-15 [min] | -15~-10 [min] | -10~-5 [min] | -5~0 [min] |
| TO GENERAL FLOOR FROM DEPARTURE FLOOR | 6 | 10 | 13 | 15 | 12 | 9 |
| TO DEPARTURE FLOOR FROM GENERAL FLOOR | 0 | 0 | 0.3 | 0.5 | 0.5 | 0.7 |
| TO UPPER FLOOR FROM GENERAL FLOOR | 0 | 0 | 0.3 | 0.5 | 0.5 | 0.7 |
| TO LOWER FLOOR FROM GENERAL FLOOR | 0 | 0 | 0.3 | 0.5 | 0.5 | 0.7 |

| TIME ZONE | DEPARTURE LOCATION | | DESTINATION | | | |
|---|---|---|---|---|---|---|
| | | | 1F | 2F | | ... |
| | | | DOORWAY | ROOM 2-1 | ROOM 2-2 | ... |
| 8:15-8:20 | 1F | DOORWAY | 0 | 15 | 30 | ... |
| | 2F | ROOM 2-1 | 0 | 0 | 0 | ... |
| | | ROOM 2-2 | 1 | 0 | 0 | ... |
| | ... | ... | ... | ... | ... | ... |
| ... | ... | ... | ... | ... | ... | ... |

| FLOOR | ROOM NAME | IN-BUILDING PERSONNEL NUMBER |
|---|---|---|
| 1F | LOBBY | 2 |
| 2F | ROOM 2-1 | 100 |
| | ROOM 2-2 | 200 |
| ... | ... | ... |

FIG. 8

| ELEVATOR ID | TYPE | CAPACITY [PERSONS] | DOOR WIDTH [mm] | RATED SPEED [m/s] | RATED ACCELERATION [m/s²] | DOOR OPENING/ CLOSING TIME [s] |
|---|---|---|---|---|---|---|
| EV1 | NORMAL | 17 | 1100 | 180 | 0.8 | 3.5 |
| EV2 | NORMAL | 17 | 1100 | 180 | 0.8 | 3.5 |
| ... | ... | ... | ... | ... | ... | ... |

| FLOOR | FLOOR HEIGHT [m] | SERVICE FLOOR | | | |
|---|---|---|---|---|---|
| | | EV1 | EV2 | EV3 | EV4 |
| B1 | 5 | ○ | ○ | — | — |
| 1F | 9 | ○ | ○ | ○ | ○ |
| 2F | 4 | ○ | ○ | — | — |
| 3F | 4 | ○ | ○ | — | — |
| ... | | ... | ... | ... | ... |

| ROOM NAME | DEMAND OCCURRENCE RATE [%] |
|---|---|
| SHOP | 0.01 |
| LAVATORY | 0.05 |
| ... | ... |

FIG. 10

| ROOM NAME | STAY TIME DISTRIBUTION [%] | | | | | | | | | | |
|---|---|---|---|---|---|---|---|---|---|---|---|
| | 0 TO 5 MINUTES | 5 TO 10 MINUTES | 10 TO 20 MINUTES | 20 TO 30 MINUTES | 30 TO 40 MINUTES | 40 TO 50 MINUTES | 50 TO 60 MINUTES | 60 MINUTES OR LONGER | | | |
| SHOP | 60 | 38 | 2 | 0 | 0 | 0 | 0 | 0 | | | |
| LAVATORY | 80 | 18 | 2 | 0 | 0 | 0 | 0 | 0 | | | |
| ... | ... | ... | ... | ... | ... | ... | ... | ... | | | |

| BUILDING USAGE | | 5-MINUTE TRANSPORTATION CAPACITY | |
|---|---|---|---|
| OFFICE BUILDING | EXCLUSIVE USE FOR ONE COMPANY | 20~25% | GENERALLY TAKE VALUE CLOSER TO LOWER LIMIT, AND TAKE VALUE CLOSER TO UPPER LIMIT WHEN RAILROAD STATION IS NEAR |
| | SEMI-DEDICATED | 16~20% | |
| | GOVERNMENT OFFICES | | |
| | RENTAL OFFICES | 11~15% | TAKE VALUE CLOSER TO UPPER LIMIT FOR RENTING FLOOR, AND TAKE VALUE CLOSER TO LOWER LIMIT FOR RENTING ROOMS |
| APARTMENT HOUSE | | 3.5~5% | TAKE UPPER LIMIT VALUE FOR HIGH-END ROOM, AND TAKE LOWER LIMIT VALUE FOR PRACTICAL ROOM |
| HOTEL | | 8~10% | TAKE UPPER LIMIT VALUE FOR LARGE HOTEL, AND TAKE LOWER LIMIT VALUE FOR MIDIUM OR SMALL HOTEL |

START PROCESSING

3001
CALCULATE LAYOUT DATA

3002
CALCULATE IN-BUILDING PERSONNEL DATA

3003
EXECUTE EVALUTION OF IN-BUILDING PERSONNEL DATA ?

T

3004
EVALUTE IN-BUILDING PERSONNEL DATA

F

3005
EXECUTE CORRECTION OF IN-BUILDING PERSONNEL DATA ?

T

3006
CORRECT IN-BUILDING PERSONNEL DATA

F

3007
CALCULATE MOVEMENT DEMAND DATA

3008
EXECUTE SIMULATION

3009
OUTPUT SIMULATION RESULT

END PROCESSING

START PROCESSING

READ BIM DATA — 3101

PROCESSING FOR
EACH OBJECT o (o∈O) — 3102

GENERATE SHAPE — 3103

ADD ATTRIBUTE — 3104

PROCESSING FOR EACH OBJECT o

GENERATE POSITION ATTRIBUTE — 3105

END PROCESSING

START PROCESSING

READ BIM DATA AND LAYOUT DATA — 3201

PROCESSING FOR
EACH ROOM s (s∈S) — 3202

ADD FLOW-IN/FLOW-OUT
ATTRIBUTE TO ROOM — 3203

PROCESSING FOR EACH ROOM s

ADD OTHER ATTRIBUTES — 3204

END PROCESSING

MOVEMENT DEMAND ESTIMATION AND PEOPLE FLOW ESTIMATION SYSTEMS AND METHODS

TECHNICAL FIELD

The present invention relates to a movement demand estimation system and a movement demand estimation method for estimating the movement demand of people inside a building, and a people flow estimation system and a people flow estimation method for estimating the flow of people based on the movement demand estimated by the movement demand estimation system.

BACKGROUND ART

At the time of installation or renewal of an elevator, it is necessary to grasp or predict a movement demand inside a building, and to carry out an appropriate installation plan and an operation plan. To appropriately carry out these plans, it is necessary to predict an operation condition and a working condition of the elevator with respect to each proposed plan.

Japanese Patent Application Laid-Open No. 2009-096612 (Patent Literature 1) discloses a background art in such a technical field. Patent Literature 1 describes a people flow calculation device that combines a intra-floor people flow simulator that simulates the movement of people, an elevator movement simulator that simulates the movement of an elevator, and an entering/leaving elevator simulator that simulates people entering/leaving an elevator to systematically simulate the horizontal and vertical flows of people in a building, and displays the flows of people on intra-floor people flow display means that displays the flow of people in a floor and elevator operation display means that displays the operation condition of the elevator (refer to the Abstract).

In addition, Japanese Patent Application Laid-Open No. 2014-010659 (Patent Literature 2) discloses a background art in such a technical field. Patent Literature 2 describes a BIM system that communicably connects to a server device and a terminal device, wherein the server device creates BIM (Building Information Modeling) parts of an elevator corresponding to a creation condition transmitted from the terminal device, and transmits the BIM part to the terminal device, and the terminal device creates an integrated BIM model in which the BIM parts transmitted from the server device are incorporated in a BIM model of a building, generates a layout screen including the integrated BIM model, displays a layout screen on a display unit, and simulates the movements of human objects and the motions of the BIM parts on the layout screen (refer to the Abstract).

CITATION LIST

Patent Literature

Patent Literature 1: Japanese Patent Application Laid-Open No. 2009-096612
Patent Literature 2: Japanese Patent Application Laid-Open No. 2014-010659

SUMMARY OF INVENTION

Technical Problem

The use of the people flow calculation device described in Patent Literature 1 and the BIM system described in Patent Literature 2 enables estimation of the flow of people including the operation condition and working condition of an elevator, and an elevator usage inside a building.

In Patent Literature 1, however, it is necessary to prepare movement demand data, layout data, and elevator installation conditions as input data. In Patent Literature 2, the layout data and the installation conditions of an elevator can be input by using BIM data and BIM parts, but the movement demand data needs to be input to create a human object simulating a person.

Therefore, in both of Patent Literature 1 and Patent Literature 2, in order to estimate the flow of people and the operation condition and working condition of an elevator, first, movement demand data needs to be prepared as an input. The creation of the movement demand data depends on the structure of a building, and also requires experience and knowledge, so that the creation is not easy. In particular, the movement demand data to be the input in Patent Literature 1 and Patent Literature 2 is data required for simulation of the movement of people for estimating the operation condition and working condition of the elevator, and needs to be created in association with the layout data. Therefore, the creation of the movement demand data requires simulation related knowledge as well as knowledge about the creation of the movement demand.

Accordingly, the present invention provides a movement demand estimation system and a movement demand estimation method for estimating movement demand data by using, for example, architectural model data such as BIM data as an input. The present invention also provides a people flow estimation system and a people flow estimation method for making estimation including operation condition and working condition of an elevator, and the flow of people by performing simulation of the operation of the elevator and the movement of people by associating the movement demand data with architectural model data such as BIM data or layout data corresponding to the architectural model data.

Solution to Problem

To solve the problem, the movement demand estimation system according to the present invention for using, as an input, architectural model data including a plurality of architectural model parts, and estimating movement demand data corresponding to the architectural model data by using the architectural model data, is characterized by including: a storage unit storing an in-building personnel database containing data in which an attribute capable of identifying a name or a usage of a room which is a space inside a building represented by the architectural model data is associated with an in-building personnel density, and a movement demand distribution database containing data in which an occurrence distribution of a movement demand with respect to a reference time is recorded for each type of a target building or each time zone; an in-building personnel calculation unit that calculates a number of in-building personnel in the building for each room or each floor from the architectural model data and the data in the in-building personnel database; and a movement demand calculation unit that calculates the movement demand data from the number of in-building personnel calculated by the in-building personnel calculation unit and the movement demand distribution database.

The movement demand estimation method according to the present invention for using architectural model data including a plurality of architectural model parts to estimate movement demand data corresponding to the architectural model data, is characterized by including: using an in-building personnel database containing data in which an attribute capable of identifying a name or a usage of a room which is a space inside a building represented by the architectural model data is associated with an in-building personnel density, and a movement demand distribution database containing data in which an occurrence distribution of a movement demand with respect to a reference time is recorded for each type of a target building or each time zone; calculating a number of in-building personnel in the building for each room or each floor from the architectural model data and the data in the in-building personnel database; and calculating the movement demand data from the number of in-building personnel calculated and the movement demand distribution database.

The people flow estimation system according to the present invention for using, as an input, architectural model data including a plurality of architectural model parts, and estimating a flow of people inside a building by using the architectural model data, is characterized by including: the movement demand estimation system; a simulation unit that estimates a flow of people and an operation of an elevator from movement demand data output by the movement demand estimation system and layout data defining a structure of the building created based on the architectural model data; a layout data conversion unit that generates the layout data from the architectural model data; and a position attribute generation unit that adds a position corresponding to a departure location and a destination of the movement demand included in usage demand data calculated by the movement demand estimation system to the layout data.

The people flow estimation method according to the present invention for using, as an input, architectural model data including a plurality of architectural model parts, and estimating a flow of people inside a building by using the architectural model data, is characterized by including: using movement demand data output by the movement demand estimation method and layout data defining a structure of the building created based on the architectural model data to add a position corresponding to a departure location and a destination of the movement demand included in the movement demand data to the architectural model data or the layout data; and estimating the flow of people and an operation of an elevator from the architectural model data or the layout data and the movement demand data.

Effect of the Invention

The present invention can provide, for example, a movement demand estimation system and a movement demand estimation method for estimating movement demand data by using architectural model data such as BIM data as an input can be provided. The present invention can also provide a people flow estimation system and a people flow estimation method for estimating the operation condition and working condition of an elevator, and the flow of people by simulating the operation of the elevator and the movement of people by associating movement demand data with architectural model data, such as BIM data, or layout data corresponding to the architectural model data.

Other problems, configurations, and effects other than those described above will be apparent from the following description of embodiments.

BRIEF DESCRIPTION OF DRAWINGS

FIG. 3 is an explanatory diagram illustrating an example of an in-building personnel database;

FIG. 4 is an explanatory diagram illustrating an example of a movement demand distribution database;

FIG. 8 is an explanatory diagram illustrating an example of elevator setting data;

FIG. 10 is an explanatory diagram illustrating an example of transition point stay time distribution data;

FIG. 11 is an explanatory diagram illustrating an example of a service level of an elevator;

DESCRIPTION OF EMBODIMENTS

Figure 1:
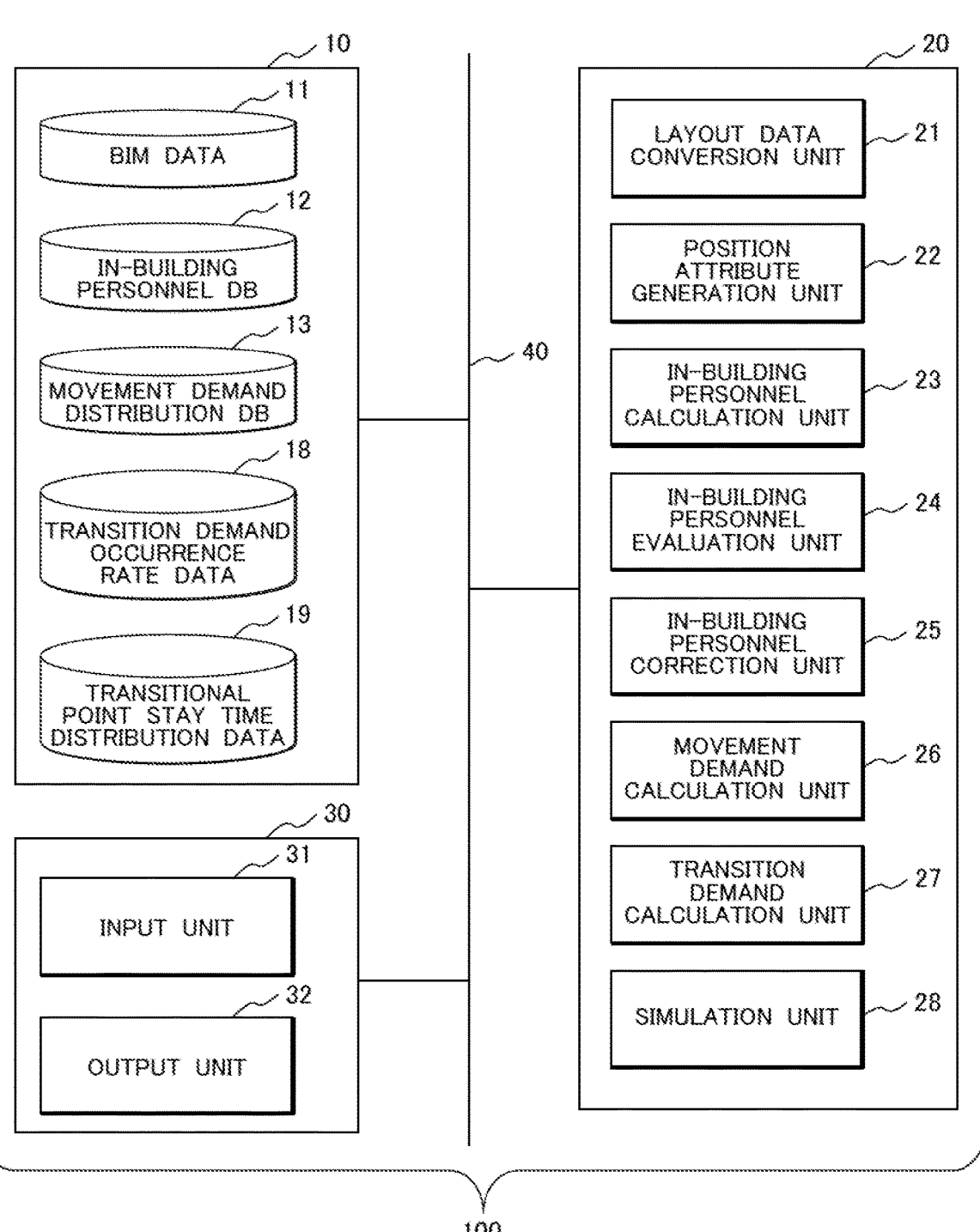
FIG. 1 is an explanatory diagram illustrating the configuration of a people flow estimation system.

The following describes embodiments of the present invention with reference to the accompanying drawings. It should be noted that substantially the same or similar components or functions are designated by same reference numerals, so that redundant descriptions may be omitted.

A movement demand estimation system according to the present invention is encompassed in a people flow estimation system according to the present invention as a subsystem of a people flow estimation system. Therefore, the description of an embodiment of the people flow estimation system also describes the constituting elements and the processing of the movement demand estimation system.

This embodiment is described using, for example, BIM data as architectural model data.

The architectural model data includes a plurality of architectural model parts. The architectural model part is data indicating architectural materials for an architecture such as a building (particularly, a high-rise building), and a facility such as an elevator. Information which constitutes the architectural model part includes at least 2D (Dimensional) or 3D (Dimensional) shape data and may include any accompanying information such as specifications, a model number, and a manufacturer. In addition, the architectural model data also includes BIM data.

EMBODIMENTS

First, the configuration of the people flow estimation system will be described.

FIG. 1 is an explanatory diagram illustrating the configuration of the people flow estimation system.

A people flow estimation system 100 described in this section estimates the flow of people (movement status) inside an architecture such as a building, the operation condition and working condition of the elevator using BIM data. The people flow estimation system 100 is comprised of a calculation system including a storage unit 10, a CPU 20, an input/output unit 30, and a bus 40.

The storage unit 10 retains, as storage data, BIM data 11 (referring to FIG. 2), an in-building personnel database (hereinafter, the database may be referred to as "DB") 12 (see FIG. 3), a movement demand distribution DB 13 (see FIG. 4), transition demand occurrence rate data 18 (see FIG. 9), transitional point stay time distribution data 19 (see FIG. 10).

In addition, the storage unit 10 retains layout data 14 (see FIG. 5), movement demand data 15 (see FIG. 6), in-building personnel data 16 (see FIG. 7), elevator design data 17 (see FIG. 8).

The storage unit 10 also appropriately stores intermediate generation information, final information and the like processed by the CPU 20. The storage unit 10 is comprised of a main storage device such as DRAM or SRAM, and an auxiliary storage device such as a hard disk drive or a flash memory.

The CPU 20 executes various arithmetic processes. The arithmetic processing is performed by running software in an arithmetic circuit of the CPU 20. Various functions performed by the CPU 20 are defined by software. For the sake of convenience, these various functions are implemented by a layout data conversion unit 21, a position attribute generation unit 22, an in-building personnel calculation unit 23, an in-building personnel evaluation unit 24, an in-building personnel correction unit 25, a movement demand calculation unit 26, a transition demand calculation unit 27, and a simulation unit 28.

The software equivalent to the layout data conversion unit 21, the position attribute generation unit 22, the in-building personnel calculation unit 23, the in-building personnel evaluation unit 24, the in-building personnel correction unit 25, the movement demand calculation unit 26, the transition demand calculation unit 27, and the simulation unit 28 is executed by the arithmetic circuit of the CPU 20. However, the software equivalent to each functional unit is not always stored in the CPU 20. For example, the software may be stored in the storage unit 10, and the CPU 20 may load each program at the time of an arithmetic operation to execute the process.

The input/output unit 30 includes an input unit 31 comprised of input devices such as a mouse and a keyboard which a user manipulates, and an output unit 32 comprised of output devices such as a display and a printer for displaying an estimation result.

The bus 40 is a common path for executing data communication among the storage unit 10, the CPU 20, and the input/output device 30.

The calculation system constituting the people flow system 100 may have a plurality of calculation systems communicatively connected to one another. For example, the storage unit 10, the CPU 20, and the input/output device 30 may individually be achieved by separate computer systems, respectively, and the bus 40 may be used as communication means for connecting the calculation systems to one another.

Next, an example of the BIM data will be described.

Figure 2:
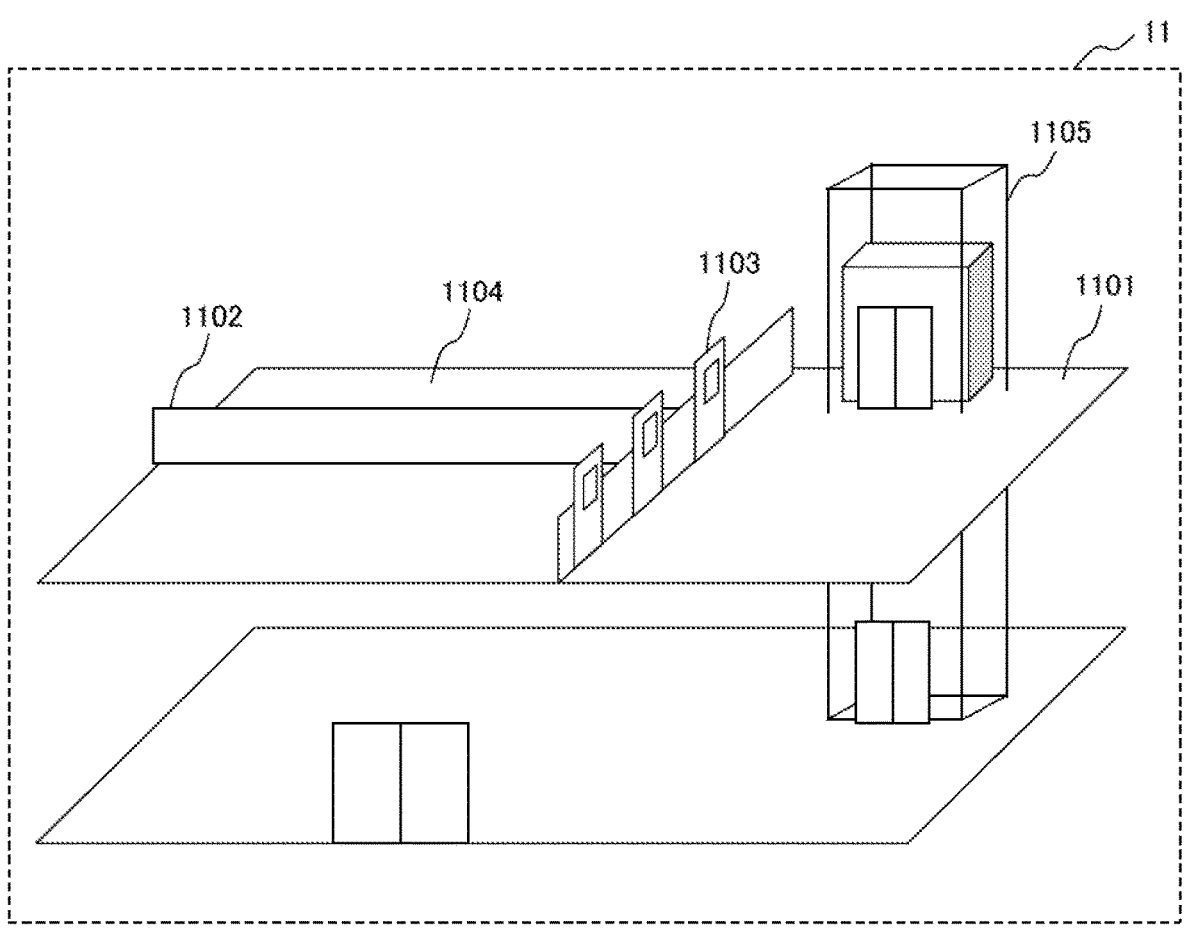
FIG. 2 is an explanatory diagram illustrating an example of BIM data.

FIG. 2 is an explanatory diagram illustrating an example of the BIM data.

The BIM data 11 is data for a computer to execute the processes of the entire life cycle covering the designing, construction and maintenance of a building. The BIM data 11 includes pieces of information such as shape data for constructing a three-dimensional model of a building, geographic information, and the cost, quantity, and useful life of architectural materials and equipment. It should be noted that the information included in the BIM data 11 is not limited to those mentioned, but at least the shape data of a building and attribute information on each room are stored in the present embodiment.

the present embodiment uses the shape data as the BIM data 11. The shape data is a set of objects which retain position information and shape information as the attribute information. The objects include, for example, floor objects 1101, wall objects 1102, and door objects 1103.

Further, the objects generally include a hierarchical structure which can retain other objects as the attribute information. For example, a room object 1104 retaining the attribute information on a room retains the floor object 1101, the wall object 1102, etc. which are associated with the room object 1104 as the attribute information.

An elevator part 1105 retains a plurality of objects, such as a hoistway object and a basket object associated with the elevator part 1105, as the attribute information. However, each of the objects does not necessarily include a hierarchical structure. For example, the elevator part 1105 may retain the room object 1104, the floor object 1101, and the wall object 1102 and the like in the same hierarchy.

Next, an example of the in-building personnel database will be described.

FIG. 3 is an explanatory diagram illustrating an example of the in-building personnel database.

The in-building personnel database 12 stores data associated with an in-building personnel density 1201 inside the building and a room name 1202 located.

The in-building personnel density 1201 is a numerical value for obtaining the number of an in-building personnel which is the number of people staying in a room regularly. For example, the numerical value represents the number of an in-building personnel per area or the number of an in-building personnel per room. The number of in-building personnel represents the number of people who are regularly working in case of an office, for example, and the number of residents in case of a dwelling house.

In the present embodiment, for example, the in-building personnel density 1201 is classified into three stages of "high" ($0.25$ person/m$^2$), "medium" ($0.10$ person/m$^2$), and "low" ($0.05$ person/m$^2$) as the number of in-building personnel per area, and divided into "fixed" (one person/room) as the number of in-building personnel per room, "no personnel" or "not eligible" as a case where there are no in-building personnel. However, the in-building personnel density should not necessarily classified in such a way.

For example, the number of in-building personnel per area may be stored in a real number for each room name 1202.

Moreover, the case where there are no in-building personnel (per room) may be managed (separately recorded) by the classification into "no personnel" (when a room can be a destination of movement) where a permanent in-building state does not occur but a person may stay, and "not eligible"

(when a room cannot be the destination of movement) where a person does not stay and merely moves. This makes it possible to distinguish the movement of a pedestrian passing through a room where no personnel is staying.

The room name 1202 is the name of a room.

The BIM data 11 manages a room as a room object 1104. The room object 1104 retains the name of the room as the attribute information. The room name 1202 retains a character string equivalent to the room name in the room object 1104. Although a corridor or the like generally is rarely treated as a room, a corridor object may be created using the room object 1104 in the BIM data 11, so that the corridor or the like is treated as a room in the present embodiment.

It should be noted that the room name 1202 is an attribute used to distinguish the use of the room, and is not limited to the use of a room name. For example, when the BIM data 11 includes an attribute which defines the usage of a room in addition to the room name, the attribute may be directly used instead of the room name.

Moreover, the in-building personnel database 12 is a DB created in advance, and different in-building personnel databases 12 may be created according to the types of target buildings and may be selectively used.

Next, an example of the movement demand distribution in database will be described.

FIG. 4 is an explanatory diagram illustrating an example of a movement demand distribution database.

The movement demand distribution DB 13 is a DB that retains data recording the distribution of the occurrence of the movement demand with respect to the reference time inside a building, and retains a distribution type (time zone) 1301 and a movement demand distribution 1302 in association with each other.

The distribution type 1301 is attribute information for classifying and identifying the movement demand distribution 1302 to be retained. For example, in an office building, it is classified into clock-in time, clock-out time, lunch time, etc. When an office building is a target, the distribution type 1301 may be further classified according to the usage of the office building (occupied by single company, tenant, or the like). The movement demand distribution 1302 is preferably distinguished by the usage such as an office or a residential use, or the time zone such as clock-in time, clock-out time and lunch time and retained accordingly.

The movement demand distribution 1302 records information that can identify movement demand distribution data 131. In this example, the movement demand distribution 1302 indicates distribution 1.

The movement demand distribution data 131 (distribution 1) is data that represents the percentage of the movement demand for each time zone. For example, the movement demand distribution data 131 is comprised of a movement type 1311 and a movement demand ratio 1312.

The movement type 1311 is information that distinguishes the type of movement. For example, in a building, the movement type is classified into movement from a departure floor, such as a lobby, to another general floor (row 1331), movement from a general floor to the departure floor (row 1332), movement from a general floor to an upper floor (general floor) (row 1333), movement from a general floor to a lower floor (general floor) (row 1334), etc.

The ratio of the traffic demand, 1312, is information showing the ratio of the traffic demand that occurs in each time zone with respect to the reference time. The reference time is the time of reference for determining the time of occurrence of a movement demand, such as the time to start working for the movement distribution at the clock-in time, the end of the working time for the movement demand distribution at the clock-out time, and the lunch start time for the movement demand at the lunch time.

The traffic demand ratio 1312 is the ratio of the number of people who belong to the movement demand in each time zone of a day, indicated as a difference from the reference time taken as "0," among the in-building personnel present in that time zone.

For example, the row 1321 is a move that occurs 30 to 5 minutes before base time. Data 1341 is the demand for movement from the departure floor of 1331 to the general floor, from 30 sentences before the base time. In this example, 6% of the total movement demand occurs during this time period. In this case, total movement demand is the total number of people present on general floors.

For example, a row 1322 is a row that shows the percentage of movement demand that occurs 10 to 5 minutes before the base time. In this example, 0.5% of the total movement demand occurs during this time period. In this case the total movement demand is the total number of persons present on the general floors.

In addition, the general floor to the upper floor of line 1333 is moved from the genera floor to the upper floor other than the departure floor. Moving demand from the general floor to the lower floor in line 1334 represents the moving demand to move from the general floor to the lower floor other than the departure floor. In line 1333 and line 1334, the total movement demand is the sum of the number of persons present on the general floor from which the movement originates.

Next, an example of layout data will be described.

Figure 5:
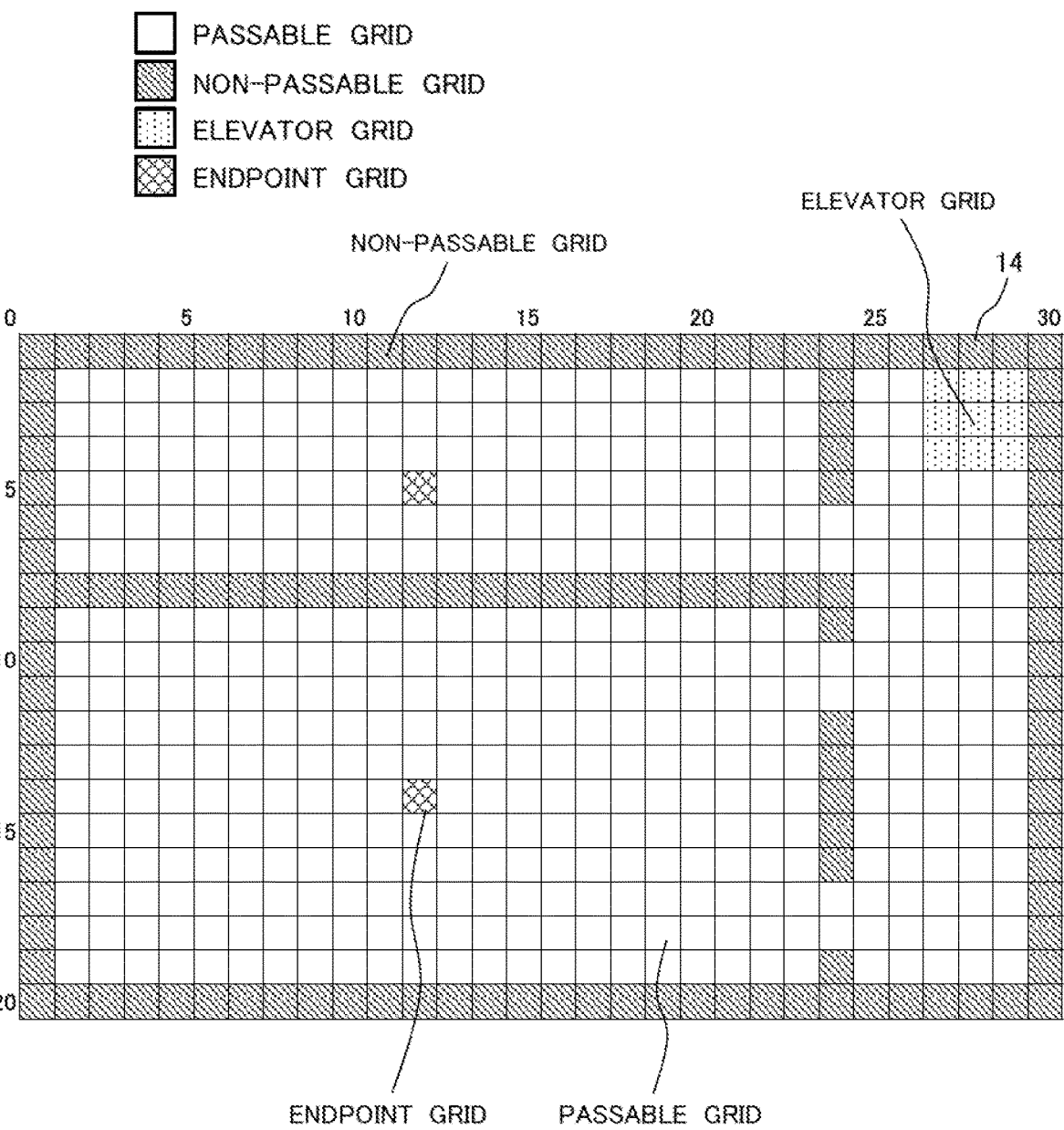
FIG. 5 is an explanatory diagram illustrating an example of layout data.

FIG. 5 is an explanatory diagram illustrating an example of layout data.

The layout data 14 is spatial shape data of a building that can be input to the simulation unit 28. For example, since a cellular automaton model (discrete calculation model based on grid-like cells and predetermined rules) is used for a pedestrian simulation in the simulation unit 28 in this embodiment, the embodiment uses grid layout data in which the space is divided into grids and represented as a set of unit grids serving as components of the space.

The unit grids are comprised of, for example, a passable grid that represents such as a passage, a non-passable grid that represents a wall or the like, an endpoint grid that is to be a generation position or destination for movement of a pedestrian agent simulating a pedestrian, and an elevator grid that represents an elevator. It should be noted that the types of unit grids are not limited to those mentioned above. For example, the unit grids are defined according to a facility contained in the space, such as a staircase grid representing a staircase and a gate grid representing a security gate.

Each unit grid has attribute information such as allowance/inhibition of passing of a pedestrian agent, a passable direction, a movement cost for the passing, generation or disappearance of the pedestrian agent, and possibility of being a destination for movement. Each unit grid retains another information related to that grid as information to be associated therewith. For example, the elevator grid retains elevator setting data 17 such as the capacity and the speed of the elevator installed at the position corresponding to the elevator grid as information to be associated with the elevator grid.

The layout data 14 is not limited to the one represented by a set of unit grids as specified in this embodiment. For example, like the BIM data 11, the layout data 14 that manages the shape, position, and attribute of each component as a set of objects may be used according to the simulation unit 28.

Lacking information as the input of the simulation unit 28 may be added to the BIM data 11, and the BIM data 11 may be used as the layout data 14. For example, information about passability of each object and information that enables the association between the elevator and the elevator setting data 17 illustrated in FIG. 8, etc. are added when the BIM data 11 is directly used as the layout data 14. Alternatively, instead of directly adding the information to the layout data 14, the objects of the BIM data 11 may be interpreted at the simulation unit 28 to be associated with passability or non-passability, and the elevator setting data 17. It should be noted that the layout data 14 has a shape created based on the BIM data 11.

Next, an example of the movement demand data will be described.

Figure 6:
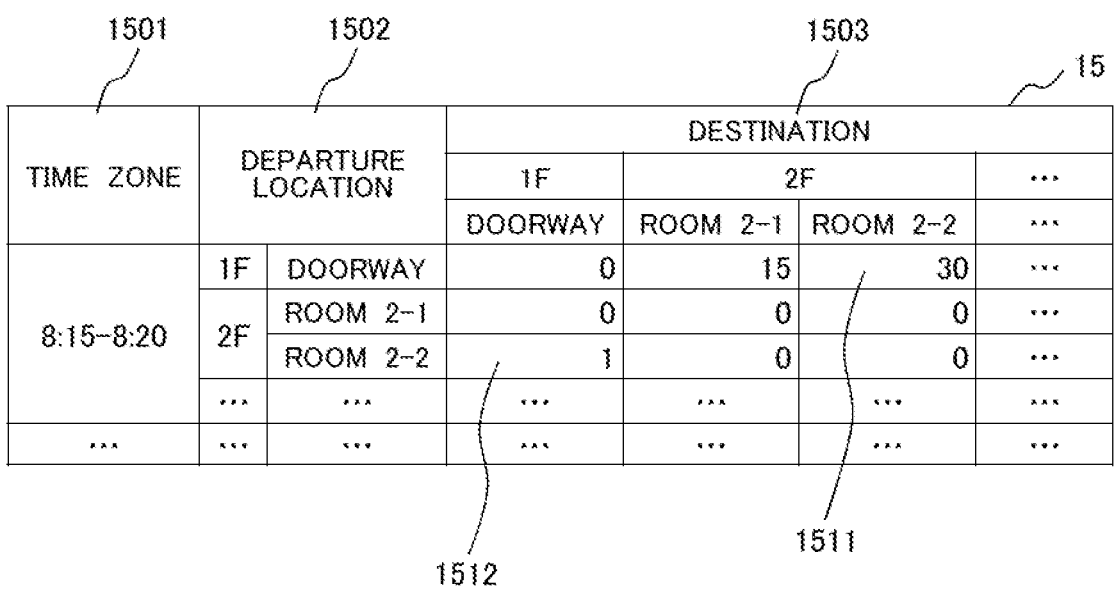
FIG. 6 is an explanatory diagram illustrating an example of movement demand data.

FIG. 6 is an explanatory diagram illustrating an example of the movement demand data.

The movement demand data 15 is data that records traffic volume (number of moving people) for each combination of a time zone 1501, a departure location 1502, and a destination 1503. The departure location 1502 and the destination 1503 represent the position at which the pedestrian agent is generated (the position of generation) or the destination to which the pedestrian agent moves (the destination position). For example, in movement inside the building, the entrance of the departure floor, the inside of each room, the entrance of each room, etc. are used for the departure location 1502 and the destination 1503.

A time zone 1501 is the time zone when traffic volume is generated.

The departure point 1502 is information that identifies the position at which traffic volume is generated, and is managed, for example, by the character string, the ID, etc. of the name of the position of generation.

The destination 1503 is information that identifies the position of the destination to which the generated traffic volume is moved. Like the departure location 1502, the destination 1503 is managed by the character string, the ID or the like of the name of the destination position.

In movement inside a building, each position information set to the departure location 1502 and the destination 1503 is often the interior or the entrance of each room. Therefore, the name or ID of the position associated with the room name 1202 is often set for the departure location 1502 and the destination 1503.

For example, data 1511 indicates traffic volume (30 people) that starts moving from the position identified by "entrance" on "1F" to the position identified by "room 2-2" on "2F" in the time zone of 8:15-8:20. Data 1512 indicates traffic volume (1 person) that starts moving from the position identified by "room 2-2" on "2F" to the position identified by "entrance" on "1F" in the time zone of 8:15-8:20.

While the movement demand data 15 may be created on the room-or-entrance basis, the movement demand data may be created as the movement demand on each floor, based on movement demands aggregated for the individual floors. For example, when an elevator is newly installed, it is not often needed to implement simulation-based estimation of the detailed operation condition or the usage condition of the elevator. In this case, an indices such as the average operation interval and five-minute transportation capacity of an elevator are calculated using commonly available traffic calculations based on the movement demand between floors.

Next, an example of the in-building personnel data will be described.

Figure 7:
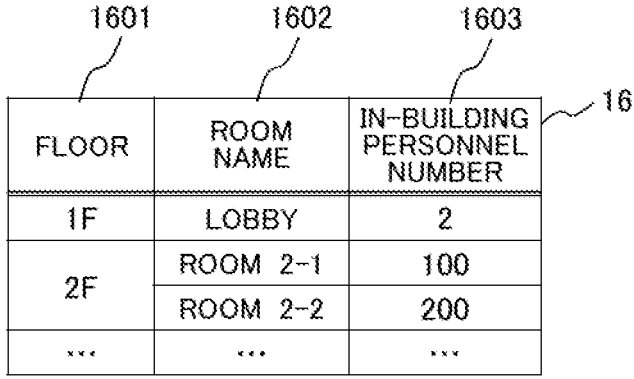
FIG. 7 is an explanatory diagram illustrating an example of building personnel data.

FIG. 7 is an explanatory diagram illustrating an example of building personnel data.

The in-building personnel data 16 is data that associates a floor 1601, a room name 1602, and an in-building personnel number 1603.

The floor 1601 stores a character string or numerical value that identifies a floor.

The room name 1602 stores a character string or a numerical value that identifies a room. The room name 1602 is related to the room name 1202 in the in-building personnel DB12 and the departure location 1502 in the movement demand data 15.

The in-building personnel number 1603 retains the number of people (persons) in the room specified by the floor 1601 and the room name 1602.

For example, the number of people in the room specified by the floor 1601 "2F" and the room name 1602 "room 2-1."

Next, an example of elevator setting data will be described.

FIG. 8 is a diagram illustrating an example of elevator setting data.

The elevator setting data 17 is data (elevator parameters) that defines the usage of an elevator, an operation condition, and the like. For example, the elevator setting data 17 is comprised of elevator specification data 171 and service floor data 172, and the like.

The elevator specification data 171 has items (parameters) of, for example, an elevator ID 1711, a type 1712, a capacity 1713, a door width 1714, a rated speed 1715, a rated acceleration 1716, and a door opening/closing time 1717.

The elevator ID 1711 is numerical value or a character string that identifies the elevator.

The type 1712 is data that identifies the type of elevator. For example, in addition to a normal type of elevator where one elevator car runs along one hoistway, a multicar type of elevator where a plurality of elevator cars runs on one hoistway, and a double-deck type of elevator with a two-story elevator car are set.

The capacity 1713 is the capacity of the elevator and is set so that no further passengers exceeding the capacity cannot ride.

The door width 1714 is the door width of the elevator, and affects the number of people who can get on and off at the same time.

The rated speed 1715 is the rated speed of the elevator.

The rated acceleration 1716 is the rated acceleration of the elevator.

The door opening/closing time 1717 is the time required to open/close an elevator door. For example, it is a duration of time from a time when the elevator car arrives at a floor to a time when the door is completely opened, and a duration of time from the time when the door starts closing to a time when the elevator car starts moving. When the time required to open the door and the time required to close the door are different, the door opening/closing time 1717 may be recorded separately for the door opening time and the door closing time.

The service floor data 172 has, for example, items of a floor 1721, a floor height 1722, and a service floor 1723.

The floor 1721 is a numerical value or a character string that identifies a floor.

The floor height 1722 is the height from the floor identified by the floor 1721 to a floor directly thereabove.

The service floor 1723 indicates the stop floor of each elevator. For example, it is indicated that the elevator identified by EV1 stops on all of floors B1, 1F, 2F, and 3F, and the elevator identified by EV3 stops on only the floor B1 among the floors B1, 1F, 2F and 3F.

The elevator setting data 17 may be individually stored in the storage unit 10, or may be included in the layout data 14 for storage.

Next, an example of transition demand occurrence rate data will be described.

Figure 9:
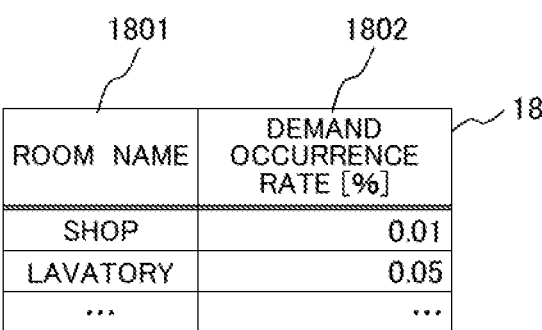
FIG. 9 is an explanatory diagram illustrating an example of transition demand occurrence rate data.

FIG. 9 is an explanatory diagram illustrating an example of the transition demand occurrence rate data.

The transition demand occurrence rate data 18 is data in which a room name 1801 serving as a transition point and a demand occurrence rate 1802 at the transition point are associated with each other. That is, the transition demand occurrence rate data 18 is data that retains an occurrence rate of a movement demand to each transition point.

The room name 1801 is information specifying a room included in the BIM data 11, like the room name 1202 in the in-building personnel DB 12, and retains, for example, the room name 1202 where the in-building personnel density 1201 serving as a transition point is set to "no personnel."

The demand occurrence rate 1802 retains a parameter for determining a demand for movement to a room identified by the room name 1801. For example, the demand occurrence rate 1802 is defined as a ratio occurred per unit time to the number of people in other rooms on a same floor. The demand occurrence rate 1802 may be set separately for each time zone such as morning or night, or may be set separately for each room of a movement source.

Next, an example of transitional point stay time distribution data will now be described.

FIG. 10 is the explanatory diagram illustrating an example of the transitional point stay time distribution data.

The transitional point stay time distribution data 19 is data in which a room name 1901, which is a transitional point, and a stay time distribution 1902, which is the distribution of the stay time in this room, are associated with each other. That is, the transitional point stay time distribution data 19 is data that retains the distribution of the stay time at the transitional point.

The room name 1901 retains a room name defined by the room name 1801 in the transition demand occurrence rate data 18.

The stay time distribution 1902 retains the distribution of the stay time in this room when movement to a room identified by the room name 1901. For example, a ratio (relative frequency) is held by each stay time. The stay time distribution 1902 is not limited to be retained in the formed of a relative frequency distribution table. For example, the type of probability distribution such as a normal distribution that defines a stay time and a parameter corresponding to the probability distribution such as mean and variance may be retained.

Next, an example of a service level of an elevator is described.

FIG. 11 is the explanatory diagram illustrating an example of the service level of the elevator.

The service level 200 of the elevator is an index used to determine the specifications of the elevator at the time of planning the installation of the elevator. The service level 200 of the elevator is the index that defines a level 2002 as a 5-minute transportation capacity for each building usage 2001.

The building usage 2001 indicates the usage of the building (building usage). For example, the building usage can be classified into an office building, an apartment house, a hotel, etc., and then the office building can be further classified into an exclusive use for one company, semi-dedicated use, a government office, and a rental office.

The level 2002 as the 5-minute transportation capacity indicates an appropriate range for the 5-minute transportation capacity. The 5-minute transportation capacity is a ratio of people, which can be carried by an elevator in 5 minutes at the peak of the movement demand, to the total number of elevator users (the number of in-building personnel in the entire building or the number of in-building personnel in the entire building excluding the number of in-building personnel on a floor adjacent to a departure floor). For example, when there is a large amount of movement demand from a departure floor, such as upon clock-in time, the 5-minute transportation capacity can be calculated by multiplying the capacity of the elevator is multiplied by the number of times the elevator can go around in 5 minutes, and then dividing the result by the number of in-building personnel in the building.

The elevator service level 200 is not limited to the one mentioned above. For example, the elevator service level 200 may be created and maintained based on other indices such as an average operation interval.

Further, the elevator service level 200 may be created and retained by combining a plurality of indices.

The following describes each functional part of the people flow estimation system 100.

The layout data conversion unit 21 in the CPU 20 has a function of converting the BIM data 11 into the layout data 14 that is input to the simulation unit 28.

For example, when the simulation unit 28 using the grid-like layout data 14 is used, shape data of a building included in the BIM data 11 is divided into grid-like shapes and converted into the layout data 14 (data of a set of unit grids) as shown in FIG. 5. For each unit grid, a unit grid matching the attribute of an object included in the BIM data 11 present at each position is arranged. However, since the attribute corresponding to an endpoint grid that corresponds to a start point or the destination of movement associating the movement demand data 15 is generally not included in the BIM data 11, the attribute is generated by using the position attribute generation unit 22.

The position attribute generation unit 22 in the CPU 20 has a function of receiving the BIM data 11 and the layout data 14, and adding a positional attribute corresponding to a position to be the starting point or the destination to the layout data 14. That is, the position attribute generation unit 22 adds the positional attribute for identifying a room object 14 to the inside of the room object of the layout data 14 or the position corresponding to a entrance.

For example, the grid corresponding to the terminal grid to be the starting point or the destination of movement is added to the layout data 14. Since the attribute, corresponding to the endpoint grid corresponding to the starting point or destination of the movement, is generally not included in the BIM data 11, the endpoint grid is added to the position corresponding to the entrance of the building or the room or the inside of the room.

Further, an identifiable specific object may be arranged in the BIM data 11 in advance so that the starting point or the destination point can be identified. In this case, the object corresponding to the endpoint grid may be added to the layout data 14 at the position corresponding to the object. The specific identifiable object in use, for example, may be a floor object that follows a specific naming rule.

The in-building personnel calculation unit 23 in the CPU 20 has a function of calculating the in-building personnel data 16 by receiving the BIM data 11 and the in-building personnel DB 12 and calculating the in-building personnel number 1603 in each room or floor included in the BIM data 11.

The in-building personnel evaluation unit 24 in the CPU 20 has a function of receiving the BIM data 11, the in-building personnel data 16 calculated by the in-building personnel calculation unit 23, and the building usage 2001 with an elevator service level 200, and determining whether the calculated in-building personnel number 1603 is appropriate (whether it is an appropriate value) (evaluating (determining) the appropriateness of the calculated in-building personnel number 1603).

Whether the calculated in-building personnel number 1603 is appropriate is determined by determining whether the in-building personnel number 1603 is in an appropriate range with respect to the specifications of the elevator by using, for example, the elevator service level 200 shown in FIG. 11.

The in-building personnel evaluation unit 24 calculates a 5-minute transportation capacity by using information (the specifications of the elevator), such as the in-building personnel data 16 calculated by the in-building personnel calculation unit 23, the elevator parts 1105 in the BIM data 11, the floor height 1722 of each floor 1721 held by the elevator installation data 17, the service floor, the stop floor 1723, the rated speed 1715, the rated acceleration 1716, and the capacity 1713. Whether the calculated in-building personnel number 1603 is appropriate is determined by determining whether the calculated 5-minute transportation capacity is within the range of the 5-minute transportation capacity level 2002 of the elevator service level 200.

The method of determining whether in-building personnel number 1603 is appropriate is not limited to the one described above. When the number of planned in-building personnel or the number of in-building personnel on each floor can be obtained as data, for example, whether the calculated in-building personnel number 1603 is appropriate may be determined by determining whether the calculated in-building personnel number is within a certain error range from the data.

That is, the in-building personnel evaluation unit 24 calculates the range of the acceptable in-building personnel by multiplying a predetermined number in-building personnel (for example, the number of planned in-building personnel or the number of in-building personnel reverse calculated from the 5-minute transportation capacity) by the allowable ratio, and determines whether the number of in-building personnel is an appropriate value depending on whether the number of in-building personnel calculated by the in-building personnel calculation unit 23 is included in the range of the acceptable number of in-building personnel.

The in-building personnel correction unit 25 in the CPU 20 receives the in-building personnel data 16 calculated by the in-building personnel calculation unit 23 and a target in-building personnel number serving as a reference for correction, and corrects the in-building personnel number 1603 calculated by the in-building personnel calculation unit 23. For example, the correction of the in-building personnel number 1603 has a function of correcting the in-building personnel number 1603 by multiplying the in-building personnel in each room by a coefficient so that the total value of the calculated in-building personnel number 1603 is matched with the target in-building personnel number.

That is, the in-building personnel correction unit 25 uses the sum of the number of in-building personnel calculated by the in-building personnel calculation unit 23 as a first in-building personnel number, uses the target in-building personnel number (the number of in-building personnel or the like in the acceptable range of the number of in-building personnel) as a second in-building personnel number, the ratio of the second in-building personnel number to the first in-building personnel number as a correction coefficient, and multiplies the number of in-building personnel of the room name calculated by the in-building personnel calculation unit 23 by the correction coefficient.

The movement demand calculation unit 26 in the CPU 20 has a function of receiving the in-building personnel data (the number of in-building personnel in each room) 16 calculated by the in-building personnel calculation unit 23, the data in the movement demand distribution DB 13, the distribution type 1301, and the reference time, and calculating the movement demand data 15. The number of in-building personnel on a floor can be calculated as the sum of the number of in-building personnel in the room on the floor.

The transition demand calculation unit 27 in the CPU 20 has a function of receiving the building personnel data 16 calculated by the in-building personnel calculation unit 23, the transit demand generation rate data 18, and the transition point stay time distribution data 19, and calculating the movement demand data 15 related to the movement (transitional action) to the transition point.

That is, the transition demand calculation unit 27 calculates the movement demand data to the transition point by multiplying the passing demand generation rate data 18 by the number of in-building personnel calculated by the in-building personnel calculation unit 23.

The simulation unit 28 in the CPU 20 has a function for estimating the flow (movement state) of a person and the movement of the elevator. The layout data 14, the movement demand data 15, and the elevator setting data 17, and estimating the flow of people and the movement of the elevator. For example, the simulation unit 28 has a function of simulating the movement of pedestrians and the operation of the elevator and calculating the congestion state of the pedestrians and the position of the car of the elevator.

For example, the simulation unit 28 in use may be a known simulation device such as the people flow simulator that simulates the movement of a person and the simulator that simulates the movement of the elevator, as described in Patent Literature 1.

The input unit 31 in the input/output unit 30 is a user interface constituted of software and hardware for receiving an operation of a user.

The output unit 32 in the input/output unit 30 displays an output result (estimation result) from the simulation unit 28 on a display device such as a liquid crystal display. A congestion index such as the number of waiting persons and waiting time for the elevator, the number of passengers and the number of persons staying in each area is outputted in the form of a numerical value, a graph or the like.

The people flow estimation system 100 according to the present embodiment includes: the BIM data 11 containing shape data of a building; the in-building personnel DB 12 associating a room name, which is the attribute of the room object, with the in-building personnel density; the movement demand distribution DB 13 recording a generation distribution of the movement demand with respect to the reference time; the layout data conversion unit 21 that converts the BIM data 11 into layout data 14; the in-building personnel calculation unit 23 that receives the layout data 14 and the data of the in-building personnel DB 12 and calculates the in-building personnel number 1603; the in-building personnel evaluation unit 24 that determines whether or not the in-building personnel number 1603 calculated by the in-building personnel calculation unit 23 is appropriate; the movement demand calculation unit 26 that calculates the movement demand data 15 from the in-building personnel number 1603 calculated by the in-building personnel calculation unit 23 and the data in the movement demand distribution DB 13; and the simulation unit 28 that receives the movement demand data 15 and the layout data 14 and estimates the flow of people.

The people flow estimation method according to the present embodiment uses the BIM data 11 to estimate the flow of people inside the building. The people flow estimation method receives the layout data 14 obtained by converting the BIM data 11 and the data in which the room name and the building personnel density inside the building are associated with each other in the building personnel DB 12, calculates the number of in-building personnel with the room name, and calculates the movement demand data from the calculated number of in-building personnel and the data in which the occurrence distribution of the movement demand with respect to the reference time in the interior of the building is recorded in the movement demand distribution DB 13.

According to the present embodiment, the BIM data (11) is inputted, movement demand data (15) is created, association between a point that can be a movement source or a movement destination of the movement demand and the movement demand data 15 is executed, and the validity (appropriateness) of the in-building personnel number 1603 serving as the base of the created movement demand data can be evaluated (determined). This makes it possible to estimate the operation condition and the working condition of the elevator and the flow (movement state) of people.

The present embodiment can also be used as an elevator traffic calculation system for executing traffic calculation, which is the calculation of indices such as the 5-minute transportation capacity and the average operation interval of the elevator.

That is, this elevator traffic calculation system can calculate an index for elevator evaluation from the movement demand estimation system described in the section of the present embodiment, the elevator setting data included in the architectural model data, and the movement demand data and the in-building personnel data calculated by the movement demand estimation system by using the architectural model data containing a plurality of architectural model parts including the elevator.

The present embodiment can also be used as an in-building personnel calculation method for calculating the number of in-building personnel in a space included in a building. That is, the in-building personnel calculation method according to the present embodiment receives architectural model data which includes a plurality of architectural model parts, and receives the architectural model data and an architectural model database containing data in which data corresponding to attribute information capable of identifying the name or usage of a space included in the architectural model data are associated with each other. The architectural model data is multiplied by the area information of the space of the architectural model data and the building personnel density corresponding to the attribute information of the space to calculate the number of in-building personnel for each space.

An example of the processing of the people flow estimation system will now be described.

Figure 12:
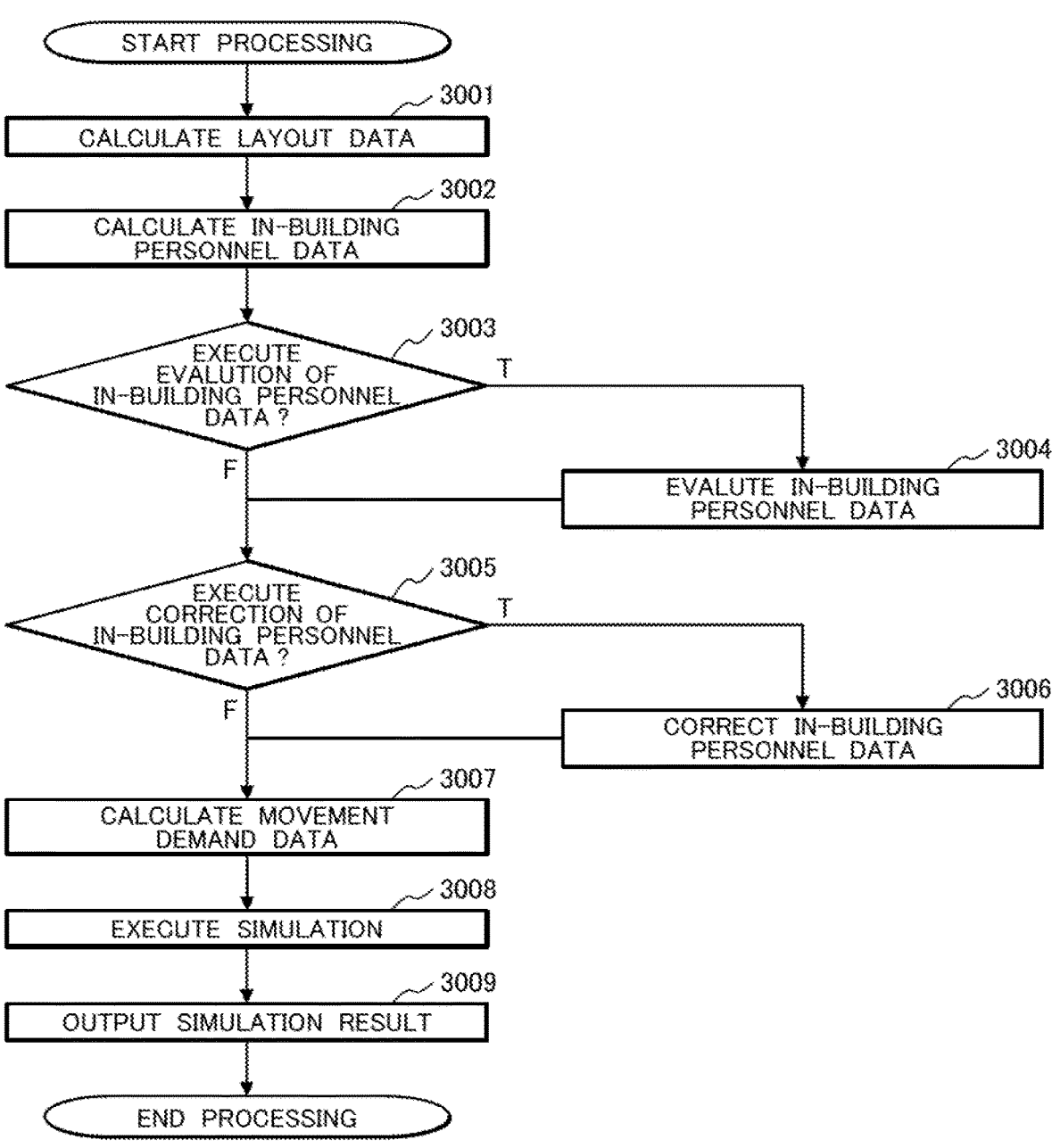
FIG. 12 is an explanatory diagram illustrating an example of the processing of the people flow estimation system.

FIG. 12 is an explanatory diagram illustrating an example of the processing of the people flow estimation system.

In processing step 3001, the BIM data 11 is input to the layout data conversion unit 21 to calculate the layout data 14. An example of the processing of the layout data conversion unit 21 will be described later with reference to the flowchart of FIG. 13.

In the processing step 3002, the layout data 14 and the data of the in-building personnel DB 12 are input, and the in-building personnel data 16 (in particular, the in-building personnel number 1603; the same is true in FIG. 12) are used by using the in-building personnel calculation unit 23. An example of the processing of the in-building personnel calculation unit 23 will be described later with reference to the flowchart of FIG. 15.

In processing step 3003, it is determined whether or not the appropriateness of the in-building personnel data 16 calculated in processing step 3002 is to be evaluated. For example, the people flow estimation system 100 determines whether or not the people flow estimation system 100 has the in-building personnel evaluation unit 24. Further, the user can be operated through the input unit 31, the flag variable for determination can be retained in the storage unit 10, and the flag variable can be used to determine the flag variable. The determination is not limited to those mentioned above. When the determination is true (expressed by symbol T), the processing proceeds to processing step 3004. When the determination is false (expressed by symbol F), the processing proceeds to processing step 3005.

In processing step 3004, the in-building personnel data 16 calculated in the processing step 3002 is input, and the in-building personnel evaluation unit 24 is used to determine the appropriateness of the in-building personnel data 16. An example of the processing of the in-building personnel evaluation unit 24 will be described later with reference to the flowchart of FIG. 16.

In processing step 3005, it is determined whether or not to execute the correction of the in-building personnel data 16 calculated in processing step 3002. For example, when it is evaluated that the in-building personnel data 16 is not appropriate in processing step 3004, it is determined that the correction is to be performed. Further, the flag variable for determination that the user can manipulate through the input unit 31 may be retained in the storage unit 10, and may be used to determine the flag variable. The determination is not limited to those mentioned above. When the determination is true, the processing proceeds to processing step 3006. When the determination is false, the processing proceeds to processing step 3007.

In processing step 3006, the in-building personnel data 16 calculated in processing step 3002 is input, and the in-building personnel data 16 is corrected by using the in-building personnel correction unit 25. An example of the processing of the in-building personnel correction unit 25 will be described later with reference to the flowchart of FIG. 17.

In processing step 3007, the movement demand data 15 is calculated using the movement demand calculation unit 26 by inputting the data of the in-building personnel data 16, the data of the movement demand distribution DB 13, the distribution type 1301, and the reference time. The distribution type 1301 and the reference time are inputted, for example, through the input unit 31 and retained in the storage unit 10. An example of the processing of the movement demand calculation unit 26 will be described later with reference to the flowchart of FIG. 18.

In processing step 3008, the layout data 14, the movement demand data 15, and the elevator setting data 17 are inputted, simulation is executed by using the simulation unit 28, and the movement of the pedestrians and the operation of the elevator are simulated to calculate the congestion state of the pedestrian and the position of the elevator car.

In processing step 3009, an output result (estimation result) from the simulation unit 28 is displayed, as a 3D model (image) simulating the movement of the pedestrians and the operation of the elevator, on the display device such as a liquid crystal display using the output unit 32. A congestion-related evaluation index such as the number of persons passing through, and the number of persons staying in, a specific area, the number of persons waiting for, and the waiting time for, the elevator, that is, the simulation result is output.

The processing of the people flow estimation system 100 is achieved by the above-described processing from processing step 3001 to processing step 3009.

The following describes the processing of each functional unit of the CPU 20. However, the description of the process of the simulation unit 28 is omitted since a well-known simulation apparatus is available.

First, an example of the processing of the layout data conversion unit 21 will be described with reference to the flowchart of FIG. 13.

Figure 13:
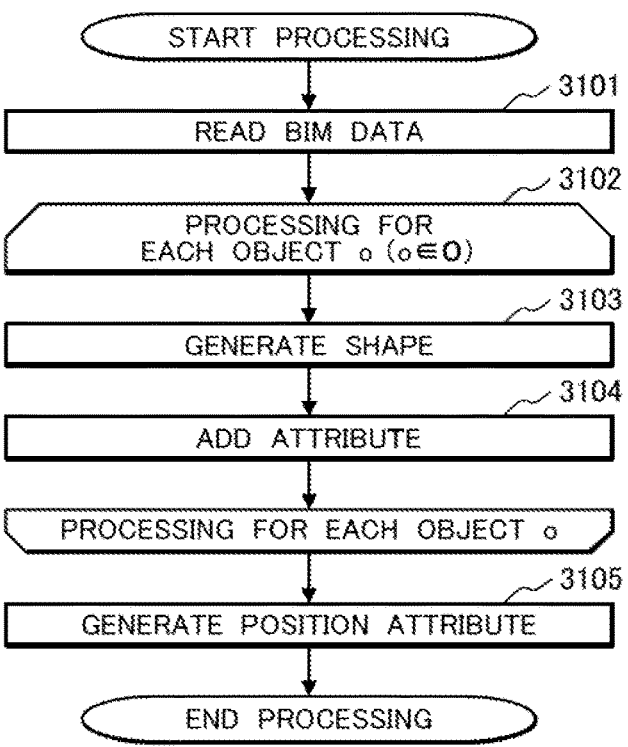
FIG. 13 is an explanatory diagram illustrating an example of the processing of a layout data conversion unit.

FIG. 13 is an explanatory diagram illustrating an example of the processing of the layout data conversion unit 21.

In processing step (3101), the BIM data (11) is read.

In processing step (3102), the processing from processing step (3103) to processing step (3104) is repeated for each object (or an object group, which is a set of a plurality of objects constituting the BIM part) o (o∈O) where O is a set of objects including the shape data included in the BIM data 11.

In processing step 3103, based on the shape data of the object o, a constituent element having the same shape as the object o and having the same function as the object o is arranged in the same position in the layout data 14 to be an output. For example, when layout data 14 having a unit grid as a constituent element is used, a passable grid of layout data 14 is arranged at a position corresponding to a floor object of the BIM data 11. A passable grid of the layout data 14 is arranged at a position corresponding to the wall object of the BIM data 11. An elevator grid of layout data 14 is arranged at a position corresponding to an object group of elevator parts of the BIM data 11.

In processing step 3104, when there is an attribute corresponding to a constituent element corresponding to the layout data 14 among the attributes of the object o, the corresponding attribute (set value) is added (duplicated) to the constituent element. For example, information such as a door width and a rated speed from the elevator parts is added (duplicated) to the elevator grid as an attribute. This attribute should not necessarily be added (duplicated) from the object O to the constituent element. For example, in some case, the layout data 14 may retain information such as the door width and the rated speed of the elevator as the elevator setting data 17 instead of an elevator grid as a constituent element of the layout data 14, and each elevator grid may retain only a pointer of the corresponding elevator setting data 17. In this case, the elevator setting data 17 corresponding to the information of the object o is created, and the corresponding elevator grid retains the pointer of the elevator setting data 17.

In processing step 3105, the BIM data 11 and the layout data 14 are input, and the position attribute generation unit 22 is used to add position attributes related to (associated with) the flow-out/flow-in point corresponding to the departure location of movement or the destination. An example of the processing of the position attribute generation unit 22 will be described later with reference to the flowchart of FIG. 14.

The processing of the layout data conversion unit 21 is achieved by the processing from processing step 3101 to processing step 3105. This makes it possible to convert the BIM data 11 into the layout data 14 that serves as an input to the simulation unit 28.

Next, an example of the processing of the position attribute generating unit 22 will be described with reference to the flowchart of FIG. 14

Figure 14:
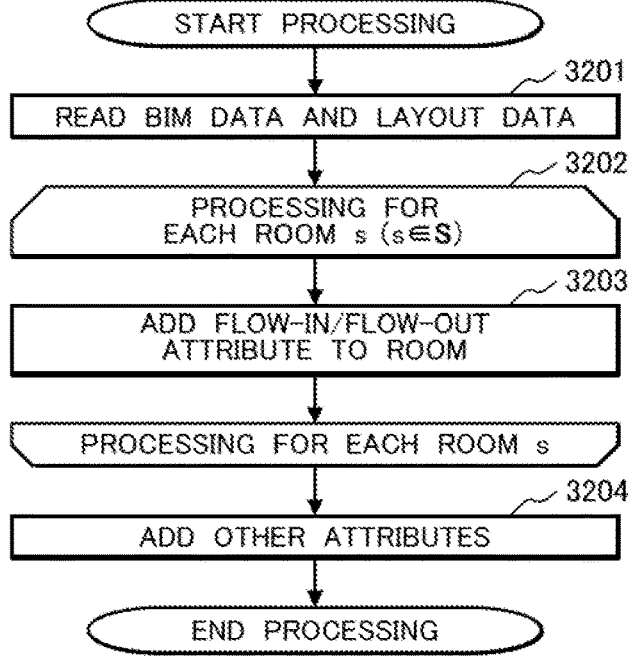
FIG. 14 is an explanatory diagram illustrating an example of the processing of a position attribute generation unit.

FIG. 14 is an explanatory diagram illustrating an example of the processing of the position attribute generation unit.

In processing step 3201, the BIM data 11 and the layout data 14 are read.

In processing step (3202), the processing of processing step (3203) is repeated for each room object (room) s (s∈S) where S is a set of room objects included in the BIM data 11.

In processing step 3203, a position attribute (a room object is specified) related to a flow-out/flow-in entry point (which identifies a room object) is added to the position of layout data 14 corresponding to the interior or the entrance of the room object s in the layout data 14 (BIM data 11). For example, a passable grid existing at a position corresponding to the center or the center of gravity or the entrance of the interior of the room object s is changed to an end point grid. The position attribute created in each room retains an ID composed of a numerical value or a character string that can be identified as the room. For example, when a position attribute is added to a position corresponding to the center of a room whose room name is "room 1," an end point grid is created as a position attribute related to a flow-out/flow-in point whose ID is the "room 1." When there are a plurality of rooms having the same room name, the numbers of the floors to which the rooms belong, the object ID of the object, etc. are added to create the position attribute with a unique ID for each room name.

In processing step 3204, position attributes (other flow-out/flow-in attributes) related to flow-out/flow-in points to be set other than the room object s are added. For example, similarly, regarding the entrance of a building, an ID composed of a numerical value or a character string which can be identified as an entrance of the building is retained, and an end point grid is set. When the BIM data 11 includes not only a building but also the shape data around the building, an end point grid may be set in the periphery of the building instead of the entrance of the building. For example, when an entrance of a railway station, a bus stop, and the like are present around the building, an end point grid may be set there. Thus, the flow of people from the periphery of the building to the entrance of the building can be estimated.

The processing of the position attribute generation unit 22 is achieved by the processing from processing step 3201 to processing step 3204. Accordingly, the position of the movement source and the movement destination can be identified, and can be associated with the movement demand data 15.

Next, an example of the processing of the in-building personnel calculation unit 23 will be described with reference to the flowchart of FIG. 15.

Figure 15:
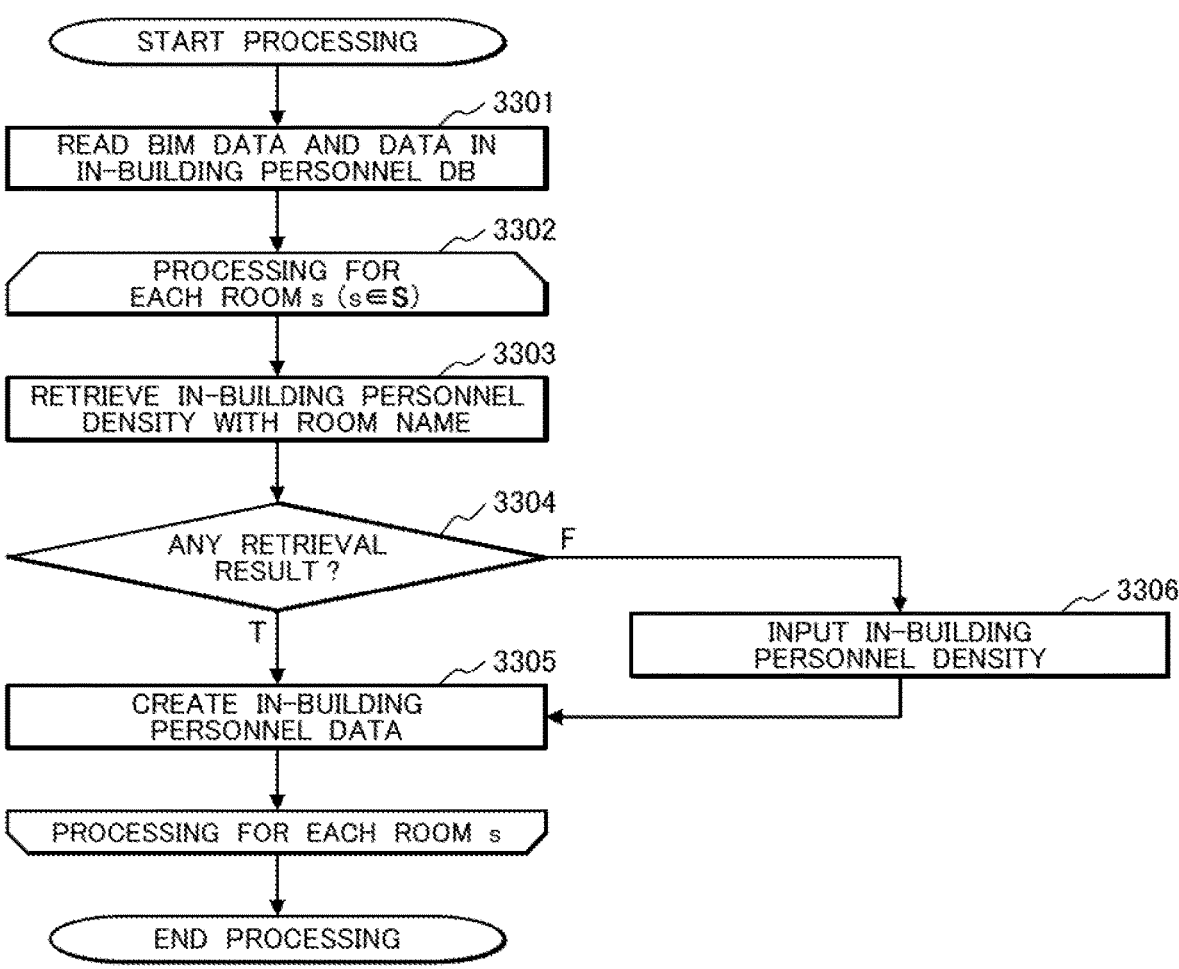
FIG. 15 is an explanatory diagram illustrating an example of the processing of an in-building personnel calculation unit.

FIG. 15 is an explanatory diagram illustrating an example of the processing of the in-building personnel calculation unit.

In processing step 3301, the BIM data 11 (layout data 14) and data on the in-building personnel DB 12 are read.

In processing step 3302, the processing from processing step 3303 to processing step 3306 is repeated for each room object s (s∈S) where S is the set of room objects included in the BIM data 11.

In processing step 3303, with the room name of the room object s used as a retrieval key, an in-building personnel density 1201 is retrieved from the in-building personnel DB 12. When there is a retrieval result, the in-building personnel density 1201 is output. When there is no retrieval result, a value indicating that there is no retrieval result is output.

For example, an integer "−1," NULL, empty object, etc. are output.

In processing step 3304, the processing is branched by the output result of processing step 3303. When there is a retrieval result in processing step 3303 and a building personnel density 1201 is output (T), the processing proceeds to processing step 3305. When there is no retrieval result in processing step 3303 and a value indicating that there is no retrieval result is output (F), the processing proceeds to processing step 3306.

In processing step 3305, the in-building personnel density 1201 retrieved in processing step 3305 or the in-building personnel density input in processing step 3306 is multiplied by the area of the room object s to calculate the number of in-building personnel in the room object s to create the in-building personnel data 16.

When the in-building personnel density is set per room, not per area, the number of in-building personnel per room is itself regarded as the number of in-building personnel, and the personnel data 16 is created. In addition, when the in-building personnel density is not input, but the number of the in-building personnel is input in processing step 3306, the in-building personnel data 16 is created using the input number of the in-building personnel.

In processing step 3306, for example, a user inputs an in-building personnel density via the input unit 31. When the user inputs the in-building personnel density, the initial value of the in-building personnel density may be input in advance. The initial value in use may be, for example, the in-building personnel density obtained using a room name having a high degree of similarity to the room name of a certain room as a retrieval key. In addition, some in-building personnel densities may be displayed as reference values for the user to select. In addition, the user may input the number of in-building personnel in place of the in-building personnel density. The input in-building personnel density may be added to the in-building personnel DB 12 in association with the room name of a certain room. This allows the in-building personnel DB 12 to expand.

The processing from processing step 3301 to processing step 3306 achieves the processing of the in-building personnel calculation unit 23. Thus, it is possible to calculate an in-building personnel density (1201) of a room object included in the BIM data (11).

Next, an example of the processing of the in-building personnel evaluation unit 24 will be described with reference to the flowchart of FIG. 16.

Figure 16:
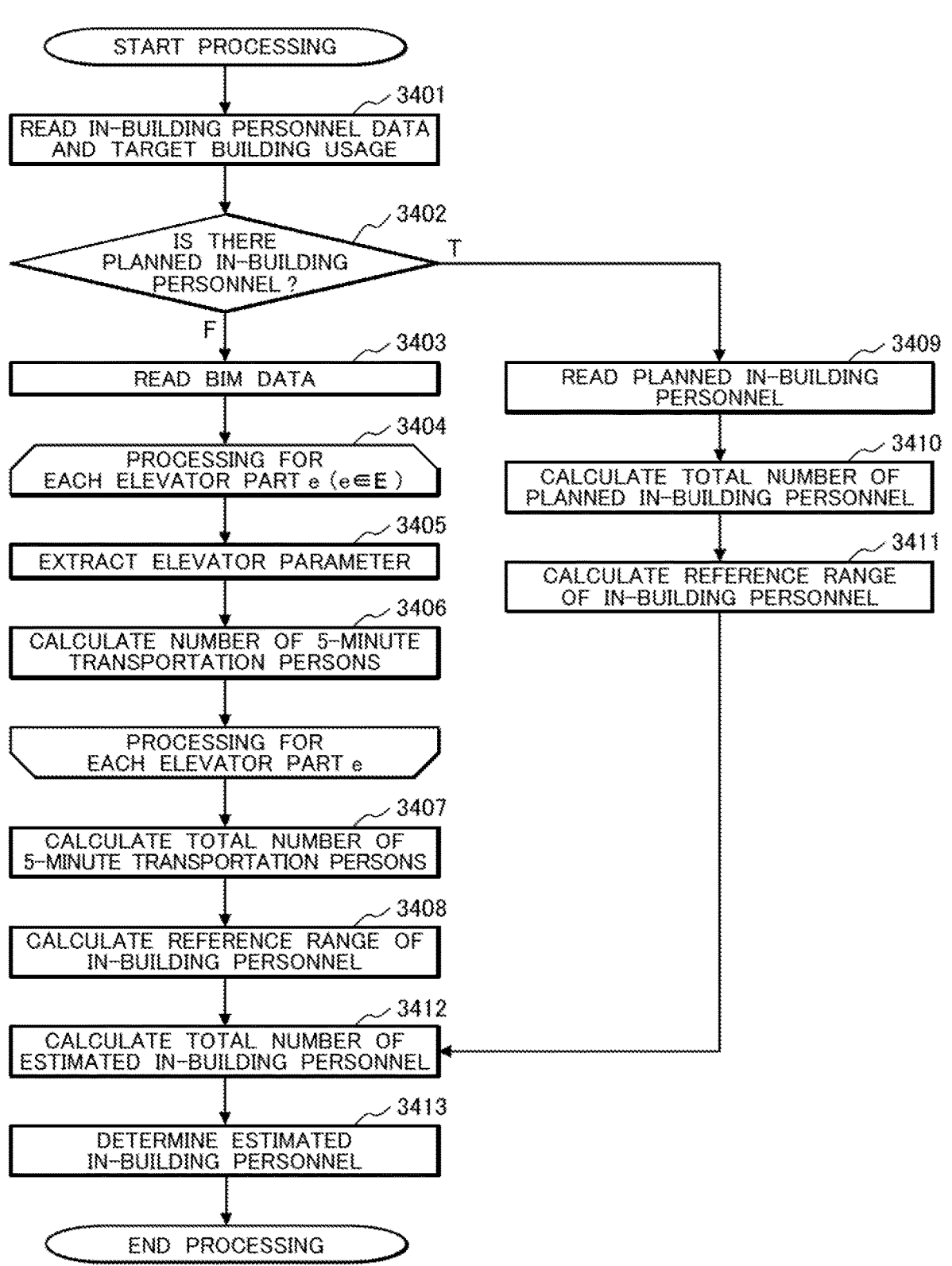
FIG. 16 is an explanatory diagram illustrating an example of the processing of an in-building personnel evaluation unit.

FIG. 16 is an explanatory diagram illustrating an example of the processing of the in-building personnel evaluation unit.

In processing step 3401, the in-building personnel data 16 is read. Further, a target building usage corresponding to one of the building usages 2001 of the service level 200 of the elevator is read. The target building usage is a building usage corresponding to a target building in the building usage 2001. For example, the target building usage is input in advance by a user through the input unit 31 and retained in the storage unit 10. In addition, a DB for associating the name of the building with the target building usage may be created, and using the DB and with the name of the building used as a retrieval key, the target building usage may be retrieved and determined.

In processing step 3402, it is determined whether or not there is data on a planned in-building personnel used at the time of designing the building or an in-building personnel corresponding thereto. If there is no planned in-building personnel (F), the processing proceeds to processing step 3403. When there is a planned in-building personnel (T), the processing proceeds to processing step 3409.

In processing step 3403, the BIM data 11 is read.

In processing step 3404, the processing from processing step 3405 to processing step 3406 is repeated for each elevator part e (e∈E) where E is a set of elevator parts included in the BIM data 11.

In processing step 3405, the elevator setting data (elevator parameters) 17 is extracted from the elevator parts or the BIM data 11. When the value corresponding to the elevator parameter is stored in the elevator part or the BIM data 11, the elevator part and the BIM data 11 are used as elevator parameters. In a case where the parameter related to the elevator specification data 171 is not stored in the elevator part or the BIM data 11, when the model number of the elevator is stored in the elevator part or the BIM data 11, each parameter is acquired from the specifications of the elevator by using the model number. On the other hand, when the model number of the elevator is not stored, the product specifications of the elevator close to the shape and size of the elevator part are used as parameters. A standard parameter determined in advance may be used. The service floor data 172 is used as the floor 1721 or the floor height 1722 as it is, with the floor and floor held in the BIM data 11 as they are. When the floor height is not stored in the BIM data 11, the floor height is calculated from the difference between the height information of the individual floors. The service floor 1723 is determined based on whether or not a door is set at each floor (or the height corresponding to each floor) in the elevator parts and BIM data 11. The method for extracting the elevator parameters is not limited this method.

In processing step 3406, the number of persons to be to be subjected to the 5-minute transportation is calculated by using the rated speed 1715, the rated acceleration 1716, the fixed staff 1713, the floor height 1722, and the service floor 1723. The number of persons to be subjected to the 5-minute transportation is calculated by multiplying the capacity of the elevator by the number of times that the elevator can go around in five minutes that can be calculated by using one round time which is the time required for the elevator to return to the departure floor again after arriving at the departure floor and having passengers loaded therein at the departure floor and moving upward for service. The one round time is calculated, for example, as the sum of the get-on/get-off time calculated on the assumption that just the fixed number of persons get on the elevator on the departure floor and persons get off the elevator at service floors in accordance with the ratio of the number of in-building personnel on each floor, the moving time of the elevator between floors that can be calculated using the floor height 1722, the rated speed 1715, and the rated acceleration 1716, and the door opening/closing time 1717, for example.

In processing step 3407, the sum of the number of persons to be transported for five minutes obtained for each elevator part is calculated as the number of persons to be transported in five minutes in the whole building.

In processing step 3408, the upper limit or the lower limit or the like of the level 2002 of the 5-minute transportation capacity of the service level 200 of the elevator is input as a reference value for the 5-minute transportation capacity, and the upper limit and the lower limit of the number of in-building personnel are calculated as a reference range (allowable range of the number of in-building personnel in the building) by dividing each reference value of the 5-minute transport capacity by the number of persons to be transported in five minutes in the whole building. The reference range of the number of in-building personnel may be multiplied by a predetermined allowable upper fluctuation and lower fluctuation ratio (allowable ratio) for a specific number of in-building personnel to calculate the upper limit and the lower limit of the reference range of the number of in-building personnel. The specific number of in-building personnel in use is a value obtained by multiplying the number of persons to be transported in five minutes in the whole building by a specific value (for example, a middle value) between the upper limit and the lower limit of the level 2002 of the 5-minute transportation capacity. The allowable upper fluctuation and lower fluctuation ratios (allowable ratios) are input in advance by a user via the input unit 31 and stored in the storage unit 10, for example.

In processing step 3409, the number of planned in-building personnel is read.

In processing step 3410, when the number of planned in-building personnel is set floor by floor, the sum of the number of planned in-building personnel is calculated as the number of planned in-building personnel in the whole building. At this time, assuming that persons who use the elevator go to floors separated from the lobby floor by two or more floors, the sum is calculated excluding the number of planned in-building personnel between the lobby floor and the floor adjoining to the lobby floor. However, floors to be excluded may vary depending on the building. For example, in a building having no equipment (facility) which can be used for the movement between floors other than the elevator, the number of planned in-building personnel on the lobby floor and the floor adjoining to the lobby floor is not excluded.

In processing step 3411, the upper limit and the lower limit of the reference range of the number of in-building personnel are calculated as the reference range (the allowable number of in-building personnel) by multiplying the number of planned in-building personnel (a predetermined number of in-building personnel) by the ratio of predetermined allowable upper fluctuation and lower fluctuation (allowable ratio). The allowable upper fluctuation and lower fluctuation ratios (allowable ratios) are input in advance by a user, for example, via the input unit 31 and stored in the storage unit 10. In processing step 3412, the sum of the in-building personnel number 1603 om the in-building personnel data 16 is calculated as the estimated number of in-building personnel in the whole building. At this time, assuming that the persons using the elevator go to floors separated from the lobby floor by two or more floors, the sum is calculated excluding the number of planned in-building personnel between the lobby floor and the floor adjoining to the lobby floor. However, floors to be excluded may vary depending on the building. For example, in a building having no equipment (facility) which can be used for the movement between floors other than the elevator, the in-building personnel data 16 for the lobby floor and the floor adjoining to the lobby floor is not excluded.

In processing step 3413, it is determined whether the estimated number of in-building personnel calculated in processing step 3412 falls within the reference range (the range between the lower limit and the upper limit of the reference value) of the number of in-building personnel calculated in processing step 3408 or processing step 3411. If the estimated number of in-building personnel is within the reference range, it is determined that the estimated number of in-building personnel is appropriate, and if the estimated number of in-building personnel is not within the reference range, it is determined that the estimated number of in-building personnel is not appropriate.

The processing of the in-building personnel evaluation unit 24 is achieved by the processing from processing step 3401 to processing step 3413. This makes it possible to determine whether or not the in-building personnel number 1603 is appropriately set.

Next, an example of the processing of the in-building personnel correction unit 25 will be described with reference to the flowchart of FIG. 17.

Figure 17:
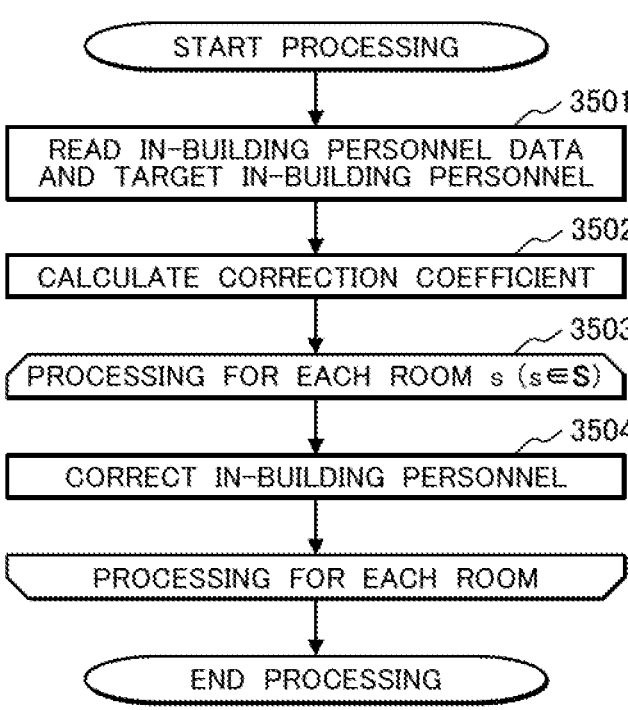
FIG. 17 is an explanatory diagram illustrating an example of the processing of an in-building personnel correction unit.

FIG. 17 is an explanatory diagram illustrating an example of the processing of the in-building personnel correction unit.

In processing step 3501, the in-building personnel data 16 and a target in-building personnel number serving as a reference for correction are read. The target in-building personnel number uses, for example, a specific value (a middle value or the like) in the range between the lower limit and the upper limit of the reference value of the number of planned in-building personnel or the number of in-building personnel calculated by the in-building personnel evaluation unit 24.

In processing step 3502, the ratio of the number of target in-building personnel (second in-building personnel number) to the sum (first in-building personnel number) of the in-building personnel data 16 is calculated as a correction coefficient. At this time, assuming that persons who use the elevator go to floors separated from the lobby floor by two or more floors, the sum is calculated excluding the number of planned in-building personnel between the lobby floor and the floor adjoining to the lobby floor. However, floors to be excluded may vary depending on the building. For example, in a building having no equipment (facility) which can be used for the movement between floors other than the elevator, the number of planned in-building personnel on the lobby floor and the floor adjoining to the lobby floor is not excluded.

In processing step 3503, the processing of processing step 3504 is repeated for each room object s (s∈S) where S is a set of room objects included in the in-building personnel data 16.

In processing step 3504, the number of in-building personnel in the building is corrected by multiplying the number of in-building personnel in the room object s (the number of in-building personnel of the room name calculated by the in-building personnel calculation unit 23) and the correction coefficient.

The processing of the in-building personnel correction unit 25 is achieved by the processing from processing step 3501 to processing step 3504. This makes it possible to correct the number of in-building personnel so that the sum of the in-building personnel number 1603 can fall within the reference range.

Next, an example of the processing of the movement demand calculation unit 26 will be described with reference to the flowchart of FIG. 18.

Figure 18:
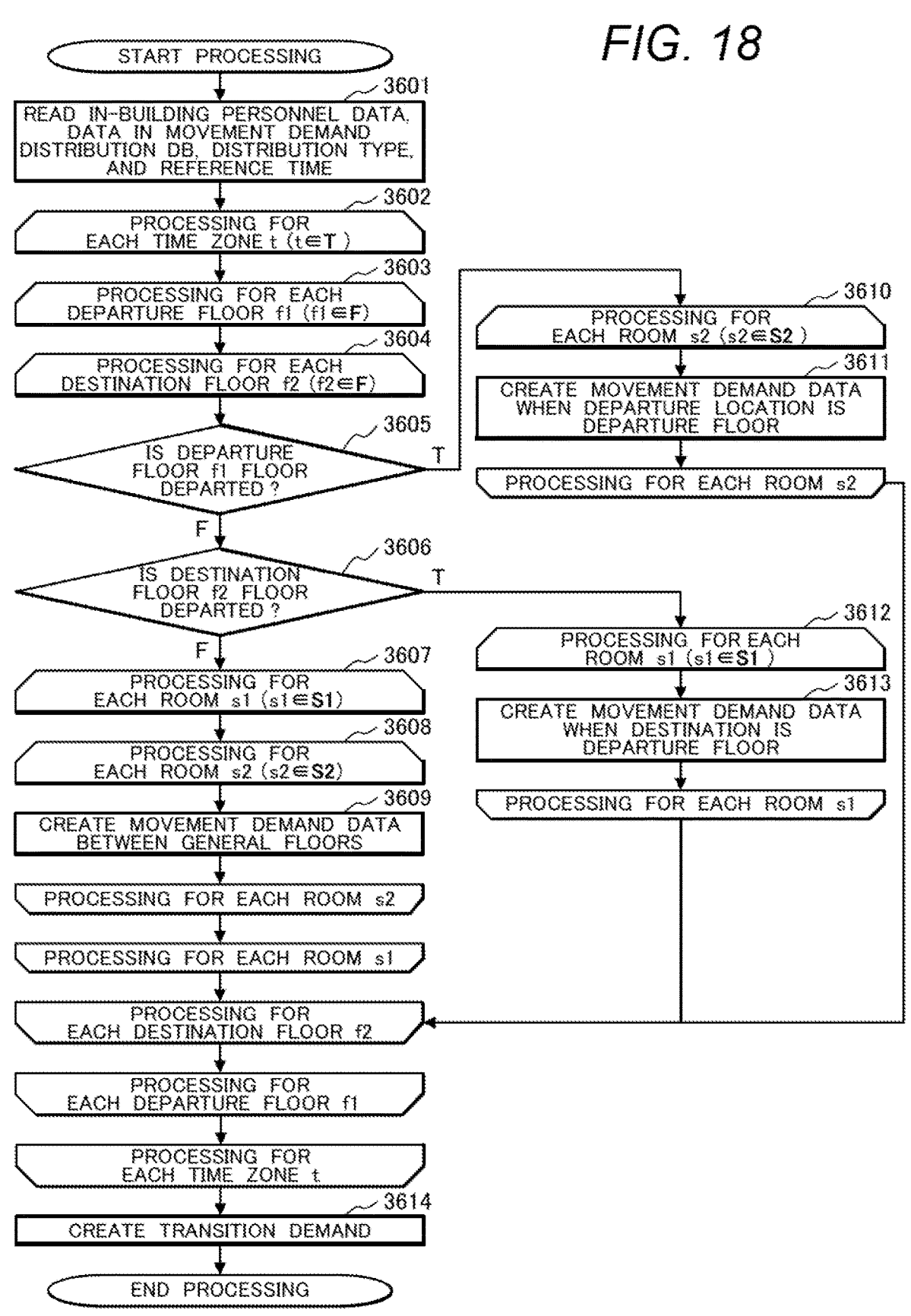
FIG. 18 is an explanatory diagram illustrating an example of the processing of a movement demand calculation unit.

FIG. 18 is an explanatory diagram illustrating an example of the processing of the movement demand calculation unit.

In processing step 3601, the in-building personnel data 16, the data in the movement demand distribution DB 13, the distribution type 1301, and the reference time are read. The distribution type 1301 and the reference time corresponding to the movement demand to be created are input to the distribution type 1301 and the reference time. The distribution type 1301 and the reference time are input, for example, via the input unit 31 and stored in the storage unit 10.

In processing step 3602, the processing from processing step 3603 to processing step 3613 is repeated for each time zone t (t∈T) where T is a set of the time zones of the relative time included in the traffic demand ratio 1312 in the movement demand distribution DB 13.

In processing step 3603, the processing from processing step 3604 to processing step 3613 is repeated for each departure floor f1 (f1∈F) where F is a set of floors included in the in-building personnel data 16 (or the BIM data 11).

In processing step 3604, the processing from processing step 3605 to processing step 3613 is repeated for each target floor f2 (f2∈F) where F is a set of floors included in the in-building personnel data 16 (or BIM data 11).

In processing step 3605, it is determined whether or not the departure floor f1 is the departure floor (lobby floor). When it is the departure floor (lobby floor) (T), the processing proceeds to processing step 3610. If it is not the departure floor (lobby floor) (F), the processing proceeds to processing step 3606.

In processing step 3606, it is determined whether or not the destination floor f2 is the departure floor (lobby floor). When it is the departure floor (lobby floor) (T), the processing proceeds to processing step 3612. If it is not the departure floor (lobby floor) (F), the processing proceeds to processing step 3607.

In processing step 3607, the processing from processing step 3608 to processing step 3609 is repeated for each room s1 (s1∈S1) where S1 is a set of rooms included in the departure floor f1.

In processing step 3608, the processing of processing step 3609 is repeated for each room s2 (s2∈S2) where S2 is a set of rooms included in the target floor f2.

In processing step 3609, each movement demand from the room s1 to the room s2 is calculated in a time zone t' of the absolute time calculated by adding the time zone t and the reference time. The movement demand is calculated by multiplying the number of in-building personnel in the room s1 and the traffic demand ratio 1312 specified by the row 1333 or the row 1334 in the movement demand distribution 1302 in the movement demand distribution DB 13 and the row corresponding to the time zone t. When the number of in-building personnel in the room s1 is not sufficiently large, the movement demand is calculated by allocating the personnel in the room s1 to each time zone in a probabilistic manner according to the traffic demand ratio 1312. The calculated movement demand is retained as the movement demand for movement from a position corresponding to the room s2 to a position corresponding to the room s2 in the time zone t' in the movement demand data 15.

In processing step 3610, the processing of processing step 3611 is repeated for each room s2 (s2∈S2) where S2 is a set of rooms included in the target floor f2.

In processing step 3611, the movement demand involving the room s2 of the destination floor f2 as the destination is calculated using the departure floor (lobby floor) as a departure location in the time zone t' of an absolute time calculated by adding the time zone t and the reference time.

The movement demand is calculated by multiplying the number of in-building personnel in the room s2 and the traffic demand ratio 1312 specified by the column 1331 in the movement demand distribution 1302 in the movement demand distribution D13 and the row corresponding to the time zone t. When the number of in-building personnel in the room s2 is not sufficiently large, the number of in-building personnel in the room s2 is probability allocated to each time zone according to the traffic demand ratio 1312 to calculate the movement demand. The calculated movement demand is retained as the movement demand for movement from a position corresponding to the departure floor (lobby floor) to a position corresponding to the room s2 in the time zone t' in the movement demand data 15.

In processing step 3612, the processing of processing step 3613 is repeated for each room s1 (s1∈S1) where S1 is a set of rooms included in the departure floor f1.

In processing step 3613, the movement demand with the departure floor (lobby floor) as the destination is calculated using the room s1 of the departure floor f1 as the departure location in the time zone t' of an absolute time calculated by adding the time zone t and the reference time. The movement demand is calculated by multiplying the number of in-building personnel in the room s1 and the traffic demand ratio 1312 specified by the column 1332 in the movement demand distribution 1302 of the movement demand distribution D13 and the row corresponding to the time zone t. When the number of in-building personnel in the room s1 is not sufficiently large, the movement demand is calculated by allocating the number of in-building personnel in the room s1 to each time zone in a probabilistic manner according to the traffic demand ratio 1312. The calculated movement demand is retained in the movement demand data 15 as the movement demand for movement from a position corresponding to the room s1 to a position corresponding to the departure floor (lobby floor) in the time zone t'.

In processing step 3614, the movement demand to be moved to the transition point is calculated by the transition demand calculating unit 27, and the transition demand is created. An example of the processing of the transition demand calculation unit 27 will be described later with reference to the flowchart of FIG. 19.

The processing of the movement demand calculation unit 26 is realized from processing step 3601 to processing step 3614. This makes it possible to calculate the movement demand data 15 by using the in-building personnel data 16.

Next, an example of the processing of the transition demand calculation unit 27 will be described with reference to the flowchart of FIG. 19

Figure 19:
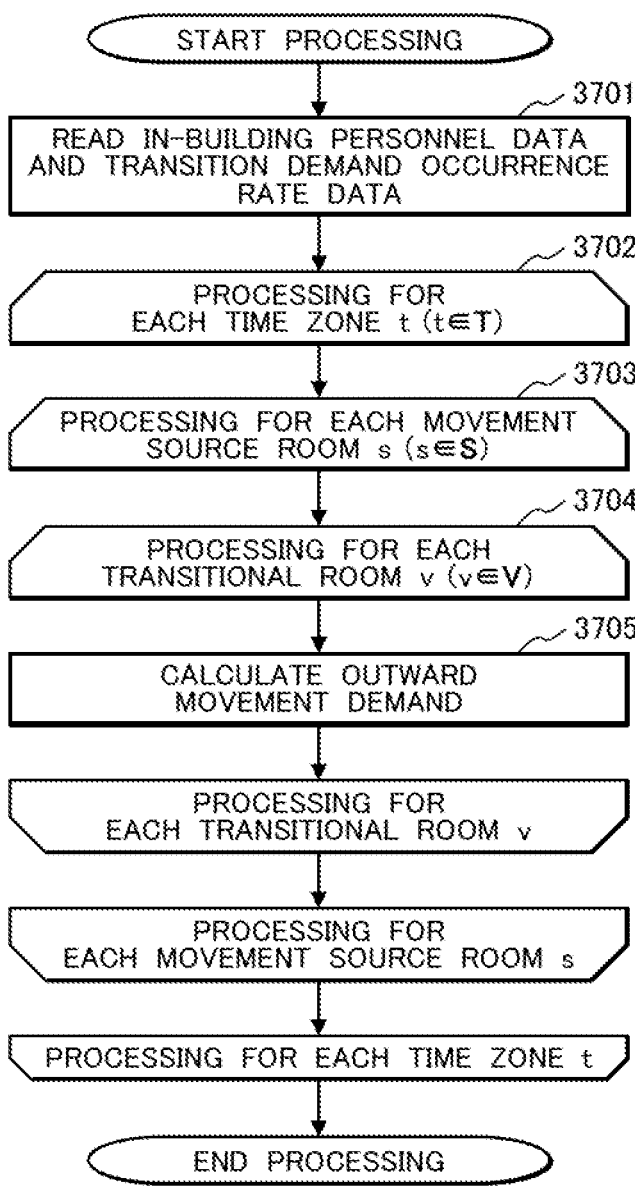
FIG. 19 is an explanatory diagram illustrating an example of the processing of the transition demand calculation unit.

FIG. 19 is an explanatory diagram illustrating an example of the processing of the transition demand calculation unit.

In processing step 3701, the in-building personnel data 16, the transition demand generation rate data 18, and the transition point stay time distribution data 19 are read.

In processing step 3702, the processing from processing step 3703 to processing step 3706 is repeated for each time zone t (t∈T) where T is a set of time zones obtained by dividing the simulation object time for each unit time defining the demand generation rate 1802 of the transit demand generation rate data 18. The division into the time zone t may be performed except for each unit time defining the demand generation rate 1802. For example, when the stay time distribution 1902 in the transition point stay time distribution data 19 is represented by a relative frequency distribution obtained by dividing the stay time at equal intervals, the time zone t may be set at the same interval as the interval of the relative frequency distribution.

In processing step 3703, the processing from processing step 3704 to processing step 3705 is repeated for each room s (s∈S) of the movement source where S is a set of rooms identified by the room name 1602 of the in-building personnel data 16.

In processing step 3704, the processing of processing step 3705 is repeated for each room v (v∈V) at the transition destination (transition point) where V is a set of rooms identified by the room name 1801 of the transition demand generation rate data 18. When there are a plurality of rooms identified by the room name 1801 of the transition demand generation rate data 18, for example, a room where the distance between the room s of the movement source is the shortest is used.

In processing step 3705, the movement demand from the movement source to the transition destination, i.e., the movement demand of the forward path is calculated. The movement demand from the movement source room s to the destination room v in the time zone t is calculated by multiplying the number of in-building personnel identified by the movement source room s and the demand generation rate identified by the transitional destination room v. The calculated movement demand is retained in the movement demand data 15 as the movement demand from the room s to the room v in the time zone t. The movement demand data 15 to the transition point may be retained as data different from the normal movement demand data 15, or may be retained in the same table.

The processing of the transition demand calculation unit 27 is achieved by the processing from processing step 3701 to processing step 3705. This makes it possible to calculate the movement demand data 15 for reproducing the movement to the position to be the transitional point.

In addition, the movement demand of the return path for reproducing the movement of the movement source room from the transitional destination room is generated, for example, at the time when the pedestrian agent generated by the transit movement demand arrives at a position to be the transitional point in the simulation unit 28.

In this way, when the pedestrian agent arrives at the transition point based on the movement demand data calculated by the transition demand calculation unit 27, the simulation unit 28 creates movement demand data with a point other than the transition point including the departure place of the pedestrian agent as a destination at a time when the pedestrian agent arrives at the transition point.

Specifically, first, the stay time distribution 1902 of the transitional point stay time distribution data 19 and a random number are used to calculate the stay time in a probabilistic manner. Next, the movement demand for moving to the room of the movement source is calculated in a time zone after the lapse of the stay time calculated from the time when the pedestrian agent arrives at a position to be the transition point. The calculation of the movement demand of the return path in this way allows the movement of the movement source back to the room to be reproduced.

In this way, the people flow estimation system 100 according to the present embodiment can easily perform simulation related to the flow (movement condition) of people, an operation condition of the elevator and the working condition by creating position information which can be a movement source or a movement destination in the movement demand data 15, the layout data 14, and the layout data 14 by using the BIM data 11 as an input.

In addition, according to the present embodiment, at the time the movement demand data 15 is created, the in-building personnel evaluation unit 24 can determine whether or not the number of in-building personnel is appropriate. The user can easily determine whether the movement demand data 15 is appropriate or not by referring to the evaluation result (determination result) of the in-building personnel evaluation unit 24. When the evaluation result is not appropriate, it can be corrected by the in-building personnel correction unit 26.

The present invention is not limited to the above-described embodiment, and various modifications are encompassed. For example, in order to describe the present invention in an easy-to-understand manner in the above-described embodiment, the system and method have been described in detail and specifically, and should not be necessarily limited to those having all the constituent elements described above.

REFERENCE SIGNS LIST

100: people flow estimation system, 10: storage unit, 11: BIM data, 12: extension personnel DB, 13: movement demand distribution DB, 13: movement demand distribution DB, 14: layout data, 15: movement demand data, 17: elevator setting data, 18: transition demand occurrence rate data, 20: CPU, 21: layout data conversion unit, 22: position attribute generation unit, 22: position attribute generation unit, 24: extension personnel evaluation unit, 26: movement demand calculation unit, 26: transit demand calculation unit, 28: simulation unit, 30: input/output unit, and 40: bus

The invention claimed is:

1. A movement demand estimation method for calculating movement demand data of a pedestrian between points inside and outside a building, the method comprising:

inputting architectural model data which is data including a plurality of architectural model parts, an in-building personnel database containing data in which attribute information capable of identifying a name or use of a space included in the architectural model data, and an in-building personnel density are association with one another, and a movement demand distribution database containing data recording a distribution of occurrence a movement demand with respect to a reference time inside the building, and calculating a number of in-building personnel from the architectural model data and the in-building personnel database;

correcting the number of in-building personnel to produce a corrected number of in-building personnel based on a target number of in-building personnel;

calculating the movement demand data based on the corrected number of in-building personnel and the movement demand distribution database; and estimating the operation condition and working condition of an elevator in the building and a flow of people by simulating operation of the elevator and movement of the people by associating the movement demand data with the architectural model data or layout data corresponding to the architectural model data.

2. A people flow estimation method for estimating a flow of people inside and outside a building using architectural model data which is data including a plurality of architectural model parts, the method comprising:

inputting architectural model data which is data including a plurality of architectural model parts, an in-building personnel database containing data in which attribute information capable of identifying a name or use of a space included in the architectural model data, and an in-building personnel density are association with one another, and a movement demand distribution database containing data recording a distribution of occurrence a movement demand with respect to a reference time inside the building;

calculating a number of in-building personnel from the architectural model data and the in-building personnel database;

correcting the number of in-building personnel to produce a corrected number of in-building personnel based on a target number of in-building personnel;

calculating movement demand data based on the corrected number of in-building personnel and the movement demand distribution database;

based on the movement demand data and layout data defining a structure of the building created based on the architectural model data, adding positions corresponding to a departure location and a destination of the movement demand to the layout data; and estimating an operation condition and a working condition of an elevator in the building and the flow of people by simulating operation of the elevator and movement of the people by associating the movement demand data with the architectural model data or the layout data corresponding to the architectural model data.

3. A movement demand estimation system for calculating movement demand data of a pedestrian between points inside and outside a building using a number of in-building personnel in the building, the system comprising:

a storage unit that records architectural model data including a plurality of architectural model parts, and an in-building personnel database containing data in which attribute information capable of identifying a name or use of a space included in the architectural model data, and the number of in-building personnel or an in-building personnel density are association with one another;

an in-building personnel calculation unit that calculates a number of in-building personnel for each room or each floor from the architectural model data and the data in the in-building personnel database;

an in-building personnel correction unit that corrects the number of in-building personnel calculated by the in-building personnel calculation unit to produce a corrected number of in-building personnel based on a target number of in-building personnel;

a movement demand calculation unit that calculates the movement demand data based on the corrected number of in-building personnel; and a simulation unit that estimates the operation condition and working condition of an elevator in the building and a flow of people by simulating operation of the elevator and movement of the people by associating the movement demand data with the architectural model data or layout data corresponding to the architectural model data.

4. The movement demand estimation system according to claim 3, wherein the architectural model data is Building Information Model (BIM) data having shape data of a building.

5. The movement demand estimation system according to claim 3, wherein the in-building personnel calculation unit calculates the number of in-building personnel by multiplying area information of the space included in the architectural model data by the in-building personnel density identified in the building personnel database from the attribute information capable of identifying the name or the use of the space.

6. The movement demand estimation system according to claim 5, wherein information corresponding to a room is used for the space.

7. The movement demand estimation system according to claim 3, wherein the building personnel database records a space where there is no in-building personnel by distinguishing between a case where the space can be a destination of movement and a case where the space cannot become a destination of movement.

8. The movement demand estimation system according to claim 3, comprising:

an in-building personnel evaluation unit that determines whether or not the number of in-building personnel calculated by the in-building personnel calculation unit is within a predetermined range.

9. The movement demand estimation system according to claim 8, wherein the in-building personnel evaluation unit calculates the allowable range of in-building personnel based on elevator setting data included in the architectural model data and a service level of an elevator.

10. The movement demand estimation system according to claim 8, wherein the in-building personnel evaluation unit calculates the predetermined range of in-building personnel based on a predetermined number of in-building personnel and an allowable ratio.

11. The movement demand estimation system according to claim 3, wherein the in-building personnel correction unit uses a sum of the number of in-building personnel calculated by the in-building personnel calculation unit as a first number of in-building personnel, uses a number of in-building personnel within the allowable number of in-building personnel as a second number of in-building personnel, and uses a ratio of the second number of in-building personnel to the first number of in-building personnel as a correction coefficient, and multiplies the number of in-building personnel in each space calculated by the in-building personnel calculation unit by the correction coefficient.

12. The movement demand estimation system according to claim 3, including a function of:

outputting in-building personnel data calculated by the in-building personnel calculation unit.

13. The movement demand estimation system according to claim 3, wherein the storage unit stores the architectural model data, the in-building personnel database, and a movement demand distribution database having data recording a distribution of occurrence of a movement demand inside a building with respect to a reference time.

14. The movement demand estimation system according to claim 13, wherein the movement demand distribution database has a movement demand distribution that is distinguished by at least one of use and a time zone.

15. A people flow estimation system for estimating a flow of people inside and outside a building included in architectural model data by using the architectural model data which is data including a plurality of architectural model parts, the system comprising:

the movement demand estimation system according to claim 3;

a layout data conversion unit that creates the layout data from the architectural model data; and a position attribute generation unit that adds a position corresponding to a departure location and a destination of a movement demand included in the movement demand data to the layout data.

16. The people flow estimation system according to claim 15, wherein architectural model data obtained from an input to the simulation unit added to the architectural model data is used as the layout data.

17. The people flow estimation system according to claim 15, comprising:

a position attribute generation unit that adds, at a position corresponding to an interior or an entrance of a room object included in the architectural model data, position information capable of identifying the room object to the architectural model data or the layout data.

18. The people flow estimation system according to claim 15, wherein transition demand occurrence rate data which is a rate of occurrence of a movement demand to a transitional point is stored in a storage unit, and the system comprises a transition demand calculation unit that calculates movement demand data to the transitional point by multiplying the transition demand occurrence rate data by the number of in-building personnel calculated by the in-building personnel calculation unit.

19. The people flow estimation system according to claim 18, wherein the storage unit has transitional point stay time distribution data which is a distribution of stay times at a transitional point, and the system comprises a simulation unit that, when a pedestrian agent arrives at a transitional point, creates movement demand data with a destination being a point other than the transitional point and including a departure location of the pedestrian agent at a time when the pedestrian agent arrives at the transitional point, based on the movement demand data calculated by the transition demand calculation unit.

\* \* \* \* \*